(12) United States Patent
Ominami et al.

(10) Patent No.: US 9,466,457 B2
(45) Date of Patent: Oct. 11, 2016

(54) OBSERVATION APPARATUS AND OPTICAL AXIS ADJUSTMENT METHOD

(71) Applicant: Hitachi High-Technologies Corporation, Minato-ku, Tokyo (JP)

(72) Inventors: Yusuke Ominami, Tokyo (JP); Mami Konomi, Tokyo (JP); Shinsuke Kawanishi, Tokyo (JP); Sukehiro Ito, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/422,531

(22) PCT Filed: Jul. 1, 2013

(86) PCT No.: PCT/JP2013/067968
§ 371 (c)(1),
(2) Date: Feb. 19, 2015

(87) PCT Pub. No.: WO2014/030435
PCT Pub. Date: Feb. 27, 2014

(65) Prior Publication Data
US 2015/0228448 A1  Aug. 13, 2015

(30) Foreign Application Priority Data

Aug. 24, 2012  (JP) ................................. 2012-184844

(51) Int. Cl.
*H01J 37/18* (2006.01)
*H01J 37/20* (2006.01)
(Continued)

(52) U.S. Cl.
CPC ............... *H01J 37/18* (2013.01); *H01J 37/04* (2013.01); *H01J 37/09* (2013.01); *H01J 37/16* (2013.01);
(Continued)

(58) Field of Classification Search
USPC ....................................................... 250/306
See application file for complete search history.

(56) References Cited

U.S. PATENT DOCUMENTS

| 7,928,380 B2* | 4/2011 | Suga ..................... H01J 37/20 250/306 |
| 8,710,439 B2* | 4/2014 | Ominami ............... H01J 37/18 250/306 |

(Continued)

FOREIGN PATENT DOCUMENTS

| EP | 1 936 363 A2 | 6/2008 |
| JP | 2008-153086 A | 7/2008 |

(Continued)

OTHER PUBLICATIONS

English translation of German Office Action dated Mar. 26, 2015 (Three (3) pages).
International Search Report (PCT/ISA/210) dated Aug. 27, 2013 with English translation (three pages).

*Primary Examiner* — Philip A Johnston
(74) *Attorney, Agent, or Firm* — Crowell & Morning LLP

(57) ABSTRACT

Ordinary charged particle beam apparatuses have each been an apparatus manufactured for dedicated use in making observations in a gas atmosphere at atmospheric pressure or at a pressure substantially equal thereto. There have existed no devices capable of simply making observations using an ordinary high-vacuum charged particle microscope in a gas atmosphere at atmospheric pressure or at a pressure approximately equal thereto. Furthermore, ordinary techniques have been incapable of observing the same spot of the sample in such an atmosphere using a charged particle beam and light simultaneously. This invention thus provides an apparatus including: a charged particle optical tube that irradiates a sample with a primary charged particle beam; a vacuum pump that evacuates the inside of the charged particle optical tube; a diaphragm arranged to separate a space in which the sample is placed from the charged particle optical tube, the diaphragm being detachable and allowing the primary charged particle beam to permeate or pass therethrough; and an optical microscope positioned on the opposite side of the charged particle optical tube across the diaphragm and the sample, the optical microscope having an optical axis thereof aligned with at least part of an extension of the optical axis of the charged particle optical tube.

16 Claims, 14 Drawing Sheets

(51) Int. Cl.
  *H01J 37/22* (2006.01)
  *H01J 37/28* (2006.01)
  *H01J 37/04* (2006.01)
  *H01J 37/16* (2006.01)
  *H01J 37/09* (2006.01)
  *H01J 37/26* (2006.01)

(52) U.S. Cl.
  CPC .............. *H01J 37/20* (2013.01); *H01J 37/228* (2013.01); *H01J 37/261* (2013.01); *H01J 37/28* (2013.01); *H01J 2237/045* (2013.01); *H01J 2237/164* (2013.01); *H01J 2237/1825* (2013.01); *H01J 2237/2602* (2013.01); *H01J 2237/2605* (2013.01)

(56) References Cited

U.S. PATENT DOCUMENTS

| | | |
|---|---|---|
| 2004/0046120 A1 | 3/2004 | Moses et al. |
| 2009/0166536 A1 | 7/2009 | Suga et al. |
| 2010/0096549 A1 | 4/2010 | Nishiyama |
| 2010/0243888 A1* | 9/2010 | Nishiyama .............. H01J 37/20 250/307 |
| 2013/0313430 A1 | 11/2013 | Ominami et al. |

FOREIGN PATENT DOCUMENTS

| | | |
|---|---|---|
| JP | 2009-158222 A | 7/2009 |
| JP | 2012-160267 A | 8/2012 |
| WO | WO 2010/001399 A1 | 1/2010 |
| WO | WO 2012/104942 A1 | 8/2012 |

* cited by examiner

OBSERVATION APPARATUS AND OPTICAL AXIS ADJUSTMENT METHOD

TECHNICAL FIELD

The present invention relates to techniques of microscopes capable of observing a sample in a predetermined gas atmosphere at atmospheric pressure or at a slightly negative pressure.

BACKGROUND ART

Scanning electron microscopes (SEM) or transmission electron microscopes (TEM) are used to observe infinitesimal regions of an object. Generally, these devices evacuate an enclosure that houses a sample to get images of the sample in a vacuum state. However, biochemical samples or liquid samples can be damaged in vacuum or can be changed in nature therein. Meanwhile, there has been a strong need for observing such samples under electron microscope. In recent years, there have been developed SEM equipment and sample holding devices that allow an observation target sample to be observed at atmospheric pressure.

In principle, these devices set up a permeable diaphragm or a tiny through hole that allows an electron beam to pass therethrough between an electron optical system and the sample, thereby separating the vacuum state from the atmospheric state. Common to these devices is the provision of the diaphragm between the sample and the electron optical system.

For example, Patent Document 1 discloses an SEM in which an electron optical tube has its electron source oriented downward and its objective lens oriented upward. The end of the electron optical tube emitting an electron beam has a diaphragm with an O-ring allowing the electron beam to pass through an emitting hole of the tube. According to the invention described in this literature, the observation target sample is directly placed on the diaphragm. The sample is then irradiated from below with a primary electron beam so that reflected or secondary electrons are detected for SEM observation. The sample is held in a space made up of the diaphragm and a circular member surrounding the diaphragm. Furthermore, this space is filled with liquid such as water.

PRIOR ART LITERATURE

Patent Document

Patent Document 1: JP-2009-158222-A (U.S. Unexamined Patent Application Publication No. 2009/0166536)

SUMMARY OF THE INVENTION

Problems to be Solved by the Invention

The ordinary charged particle beam apparatuses have been manufactured so as to be dedicated to making observations in a gas atmosphere at atmospheric pressure or at a pressure substantially equal thereto. There have existed no devices capable of simply making observations under an ordinary high-vacuum charged particle microscope in a gas atmosphere at atmospheric pressure or at a pressure approximately equal thereto.

For example, the SEM described in Patent Document 1 is a very special device in structural terms. The device is incapable of making SEM observations in the ordinary high-vacuum atmosphere.

Furthermore, the method of Patent Document 1 does not disclose any technique for simultaneously observing the same spot of the sample both under the charged particle beam and under light.

The present invention has been made in view of the above circumstances and provides a composite type microscope apparatus that permits observation of the sample in an air atmosphere, in a vacuum, or in a desired gas atmosphere without significantly changing the structure of the existing high-vacuum charged particle microscope, the composite type microscope apparatus being further capable of sample observation as both a charged particle beam microscope and an optical microscope.

Means for Solving the Problem

To solve the above-described problem, there may be adopted, for example, the structures described in the appended claims of this application.

This application includes multiple means for solving the above-described problem, one such means including: a charged particle optical tube that irradiates a sample with a primary charged particle beam; a vacuum pump that evacuates the inside of the charged particle optical tube; a diaphragm arranged to separate a space in which the sample is placed from the charged particle optical tube, the diaphragm being detachable and allowing the primary charged particle beam to permeate or pass therethrough; and an optical microscope positioned on the opposite side of the charged particle optical tube across the diaphragm and the sample, the optical microscope having an optical axis thereof aligned with at least part of an extension of the optical axis of the charged particle optical tube.

Effect of the Invention

According to the present invention, there is provided a composite type microscope apparatus that permits observation of the sample in an air atmosphere, in a vacuum, or in a desired gas atmosphere without significantly changing the structure of the existing high-vacuum charged particle microscope, the composite type microscope apparatus being further capable of sample observation as both a charged particle beam microscope and an optical microscope.

Further problems, structures, and advantages other than those stated above will become apparent upon a reading of the ensuing explanation of some embodiments of the present invention.

MODE FOR CARRYING OUT THE INVENTION

Some embodiments of the present invention will now be explained with reference to the accompanying drawings.

What follows is an explanation of charged particle beam microscopes as an example of the charged particle beam apparatus. It should be noted that these microscopes are only an example embodying the present invention and that the invention is not limited to the embodiments to be discussed hereunder. The present invention can be applied to scanning electron microscopes, scanning ion microscopes, scanning transmission electron microscopes, a composite device that combines any of these microscopes with sample processing equipment, or analyzer/inspection equipment that applies any of these microscopes. In this description, the wording "atmospheric pressure" refers to an air atmosphere or a predetermined gas atmosphere and signifies a pressure environment under atmospheric pressure or in a somewhat negatively or positively pressured state. Specifically, the environment is to be at about $10^5$ Pa (atmospheric pressure) to about $10^3$ Pa.

Also in this description, the wording "optical microscope" refers to a wide range of devices used to observe the state of an object under light.

First Embodiment

Figure 1:
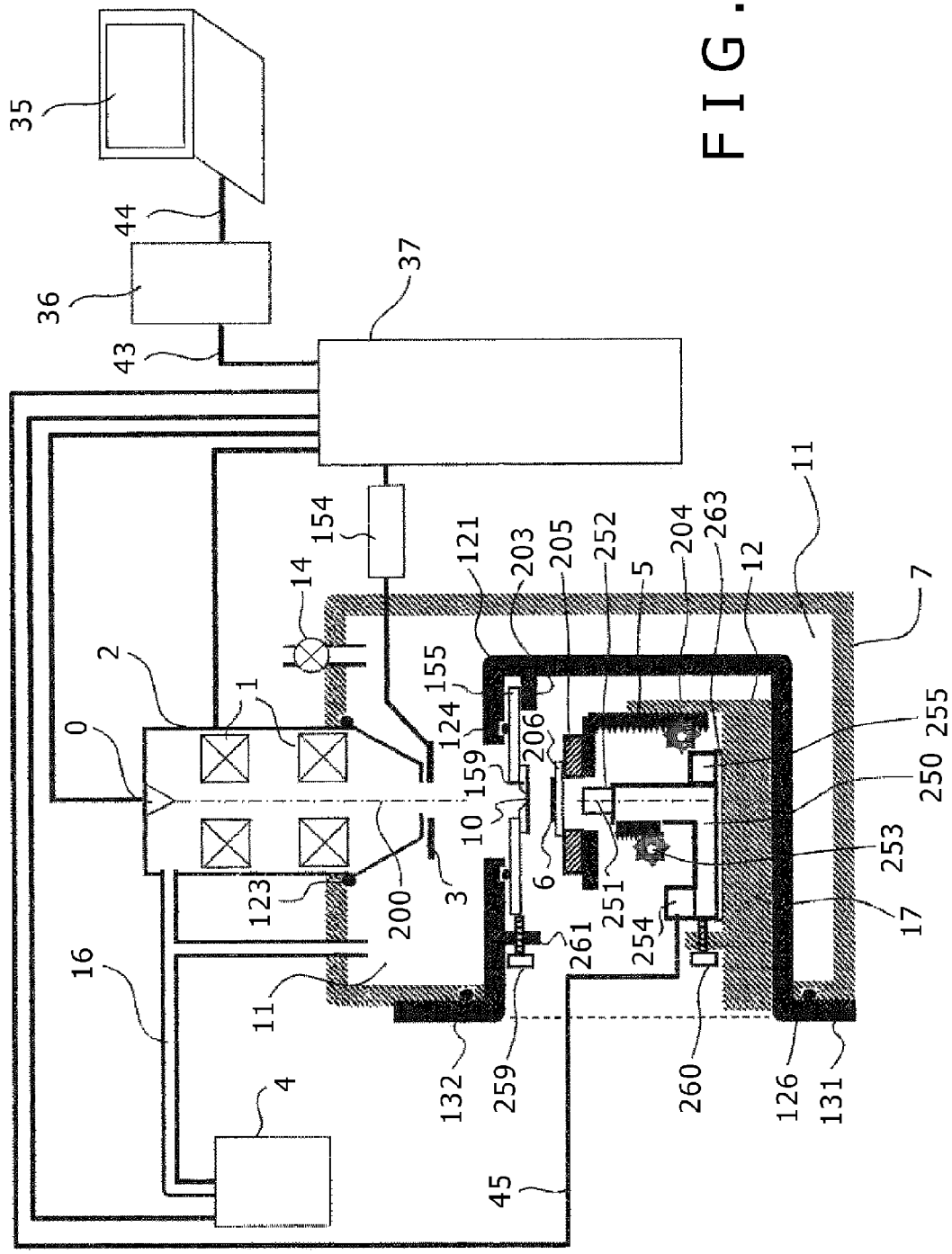
FIG. 1 is an overall block diagram of a charged particle microscope as a first embodiment of the present invention.

The first embodiment is explained here as the basic mode for carrying out the invention. FIG. 1 is an overall block diagram of a charged particle microscope as the first embodiment. The charged particle microscope shown in FIG. 1 is mainly constituted by a charged particle optical tube 2, a first enclosure 7 (also called the vacuum chamber hereunder where appropriate) that supports the charged particle optical tube against an apparatus installation surface, a second enclosure 121 (also called the attachment hereunder where appropriate) inserted into the first enclosure 7 when used, a sample stage 5 installed inside the second enclosure, an optical microscope 250 for observing a sample 6 from below in the drawing, and a control system that controls these components. When the charged particle microscope is to be used, the inside of the charged particle optical tube 2 and that of the first enclosure are evacuated by a vacuum pump 4. The control system also controls the start and stop of the vacuum pump 4. Although only one vacuum pump is shown, two or more vacuum pumps may be provided alternatively. In the first embodiment, the attachment is inserted in and fixed to the vacuum chamber from above its opening for use, the vacuum chamber being furnished in the charged particle microscope, the attachment accommodating the sample while keeping the internal pressure higher than that of the vacuum chamber. The opening of the vacuum chamber is provided typically on one side or at the bottom of the chamber. The attachment has the function of holding the diaphragm that lets a primary charged particle beam permeate or pass therethrough, thereby securing the difference in pressure between the vacuum chamber and the inside of the attachment.

The charged particle optical tube 2 is made up of such elements as a charged particle source 0 that generates a charged particle beam, and an optical lens 1 that focuses the generated charged particle beam at the bottom of the tube as a primary charged particle beam for scanning the sample 6. The charged particle optical tube 2 is positioned in a manner protruding into the first enclosure 7 and fixed to the first enclosure 7 by means of a vacuum sealing member 123. The tip of the charged particle optical tube 2 has a detector 3 that detects secondary particles (secondary or reflected electrons, etc.) stemming from irradiation with the primary charged particle beam.

The charged particle microscope of the first embodiment has the control system that includes a computer 35 used by an apparatus user, a master control unit 36 connected with the computer 35 to conduct communications, and a slave control unit 37 that controls an evacuation system and a charged particle optical system, among others, under instructions from the master control unit 36. The computer 35 has a monitor that displays an apparatus operation screen (GUI) and input means such as a keyboard and a mouse for making entries into the operation screen. The master control unit 36, slave control unit 37 and computer 35 are interconnected by communication lines 43 and 44.

The slave control unit 37 is a unit that sends and receives control signals for controlling the vacuum pump 4, charged particle source 0, and optical lens 1. Also, the slave control unit 37 converts the output signal from the detector 3 into a digital image signal before transmitting the signal to the master control unit 36. In FIG. 1, the output signal from the detector 3 is connected to the slave control unit 37 via a signal amplifier 154 such as a preamplifier. The signal amplifier may be omitted if unnecessary.

In the master control unit 36 and slave control unit 37, both analog and digital circuits may coexist. The master control unit 36 and slave control unit 37 may alternatively be unified into a single unit. It should be noted that the structure of the control system shown in FIG. 1 is only an example and that variations of the control units, valves, vacuum pumps, communication wiring, etc., fall within the scope of the SEM or the charged particle beam microscope of the first embodiment as long as such variations fulfill the functions intended by this embodiment.

The first enclosure 7 is connected with vacuum piping 16 of which one end is coupled to the vacuum pump 4, so that the inside of the first enclosure 7 is kept in a vacuum state. Also, the first enclosure 7 has a leak valve 14 that exposes the enclosure interior to the atmosphere. At the time of maintenance, the leak valve 14 can expose the inside of the first enclosure 7 to the atmosphere. Installation of the leak valve 14 is optional. There may be two or more leak values 14 installed. Installation of the leak valve 14 on the first enclosure 7 is not limited to the location shown in FIG. 1; the valve may be located elsewhere on the first enclosure 7. Furthermore, the first enclosure 7 has on its side an opening through which the second enclosure 121 is inserted.

The second enclosure 121 is composed of a cuboid-shaped main unit 131 and a matching unit 132. At least one side of the main unit 131 as the cuboid is an open side 9, as will be discussed later. Except for one of the sides of the cuboid-shaped main unit 131 to which a diaphragm holding member 155 is attached, the sides of the main unit 131 may be formed by the walls of the second enclosure 121. Alternatively, the second enclosure 121 may be devoid of its own walls. Instead, the second enclosure 121 may be formed by the sidewalls of the first enclosure 7 into which the second enclosure 121 is built. The main unit 131 is inserted into the first enclosure 7 through the above-mentioned opening. In its built-in state, the main unit 131 has the function of storing the sample 6 to be observed. The matching unit 132 has a matching surface against the outer wall surface of the side on which the opening of the first enclosure 7 is provided, and is fixed to that outer wall surface by means of a vacuum sealing member 126. The second enclosure 121 may be fixed either to one side or inner wall surface of the first enclosure 7 or to the charged particle optical tube. In this manner, the second enclosure 121 as a whole is fit into the first enclosure 7. The above-mentioned opening is formed most simply by utilizing the opening that is intrinsically provided to the vacuum sample chamber of the charged particle microscope and is used for bringing in and out the sample. That is, the second enclosure 121 may be manufactured in a manner conforming to the size of the existing hole of which the circumference may be furnished with the vacuum sealing member 126. As a result, the effort to remodel the apparatus can be minimized. Also, the second enclosure 121 may be detached from the first enclosure 7.

One side of the second enclosure 121 is an open side communicating with the air atmosphere and large enough to at least bring in and out the sample therethrough. The sample 6 housed inside the second enclosure 121 (a space to the right of the dotted line in FIG. 1, called the second space hereunder) is in an atmospheric state during observation. Incidentally, although FIG. 1 is a sectional view of the apparatus in parallel with the optical axis and shows only one open side 9, there may be more than one open side 9 for the second enclosure 121 as long as the opening is vacuum-sealed by those sides of the first enclosure in the depth and at the front of FIG. 1. There need only be at least one open side where the second enclosure 121 is built into the first enclosure 7. The open side of the second enclosure (attachment) allows the sample to be brought into and out of the attachment.

A diaphragm 10 is provided on the upper surface side of the second enclosure 121. The vacuum pump 4 is connected to the first enclosure 7 so that a closed space (called the first space hereunder) formed by the inner wall surfaces of the first enclosure 7, the outer wall surfaces of the second enclosure, and the diaphragm 10 can be evacuated. Thus in the first embodiment, the diaphragm 10 keeps the first space 11 in a high-vacuum state, while the second space 12 is maintained in a gas atmosphere at atmospheric pressure or at a pressure approximately equal thereto. This allows the first embodiment to keep the charged particle optical tube 2 and the detector 3 in the vacuum state during operation of the apparatus while maintaining the sample 6 at atmospheric pressure.

According to the existing techniques such as the environmental cell that can locally maintain an air atmosphere, it is possible to observe the sample in an air or gas atmosphere only if the sample is small enough to be inserted into the cell. Larger samples cannot be observed in the air/gas atmosphere. Moreover, in the case of the environmental cell, observing different samples requires performing a troublesome sample replacement procedure. That is, the environmental cell is required to be extracted from the vacuum sample chamber of the SEM and, with the current sample replaced by a new sample, again brought into the vacuum sample chamber. By contrast, according to the method of the first embodiment, one side of the second enclosure 121 is left open so that the sample 6 as large as a semiconductor wafer can be placed in the second space 12 constituting an extensive atmospheric pressure space for observation under atmospheric pressure. In particular, the second enclosure of the first embodiment can be easily made large in size because it is configured to be inserted laterally into the sample chamber. A sample too large to be placed into the environmental cell can thus be observed. Furthermore, the second enclosure 121 has the open side that allows samples to be switched easily between the inside and the outside of the second space 12 during observation.

The upper surface side of the second enclosure 121 is provided with the diaphragm 10 that is positioned immediately under the charged particle optical tube 2 when the entire second enclosure 121 is fit into the first enclosure 7. The diaphragm 10 is arranged to separate the space where the sample is placed from the inside of the charged particle optical tube, thereby maintaining the difference in pressure between these spaces. The diaphragm 10 allows the primary charged particle beam discharged from the lower end of the charged particle optical tube 2 to permeate or pass therethrough. Past the diaphragm 10, the primary charged particle beam ultimately reaches the sample 6.

In the past, the sample was held in a liquid-filled space inside of the diaphragm. Once the sample was observed in the atmosphere, the sample became wet so that it was very difficult to observe the sample in the same state in both the air atmosphere and the high-vacuum atmosphere. Another problem was that since the diaphragm was always in contact with liquid, the diaphragm was highly liable to break. By contrast, the method of the first embodiment involves keeping the sample 6 out of contact with the diaphragm 10 so that the sample can be observed in both the high-vacuum atmosphere and the air atmosphere without changing its state. Furthermore, the diaphragm is less likely to break because the sample is not placed thereon.

<About the Diaphragm>

Figure 2:
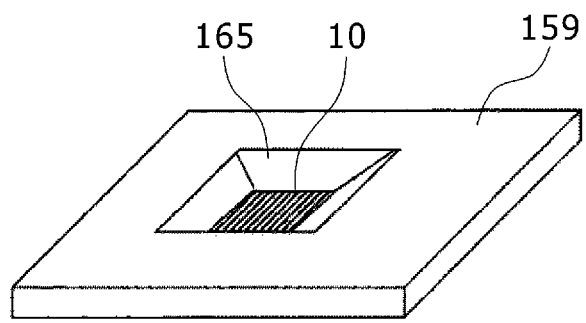
FIG. 2 is a detail plan of a diaphragm.

FIG. 2 is a detail plan of the diaphragm 10. The diaphragm 10 is formed or deposited on a base 159. The diaphragm 10 is made of a carbon material, an organic material, silicon nitride, silicon carbide, or silicon oxide. The base 159 is a member made of silicon for example, and has a tapered hole 165 formed typically by wet etching as illustrated. The diaphragm 10 is positioned at the bottom as shown in FIG. 2. The diaphragm 10 may be formed by multiple windows. The diaphragm that allows the primary charged particle beam to permeate or pass therethrough is to have a thickness of approximately several nm to several μm. In place of the diaphragm, there may be provided an aperture member having a hole that lets the primary charged particle beam pass therethrough. In this case, the hole should preferably be 1 $mm^2$ or less in area in view of the requirement that a commonly available vacuum pump be capable of differential evacuation. Where the charged particle beam is an ion beam, an aperture with an area of less than about 1 $mm^2$ is used because the penetration is difficult to achieve without damaging the diaphragm.

Also, the diaphragm is required not to break because of the difference in pressure between atmospheric pressure and vacuum. This means that the area of the diaphragm should range from tens of μm to several mm at most. The shape of the diaphragm 10 is not limited to a square; the diaphragm may also have some other shape such as a rectangle. In fact, the diagram may be shaped in any suitable manner. The side shown in FIG. 2, i.e., the side where the tapered part 165 is provided is arranged to be on the vacuum side (upper side in the drawing). This arrangement is intended for the detector 3 efficiently to detect secondary charged particle beams released from the sample.

Having reached the sample 6 after permeating or passing through the diaphragm 10, the charged particle beam causes secondary particles such as reflected or permeated charged particles to be discharged from the surface or from inside of the sample. The detector 3 detects the secondary particles. The detector 3 is a detecting element capable of detecting and amplifying charged particle beams emitted with several to tens of KeV of energy. For example, the detecting element may be a semiconductor detector made of a semiconductor material such as silicon, or may be a scintillator capable of converting charged particle signals into light internally or by use of its glass surface.

<About the Diaphragm Fixing Parts>

The base 159 fitted with the diaphragm 10 is mounted on the diaphragm holding member 155. The diaphragm holding member 155 is mounted on the upper side of the second enclosure 121. The clearance between the diaphragm holding member 155 and the second enclosure 121 is vacuum-sealed with a vacuum sealing member 124 such as an O-ring and vacuum seals including packing. Although not shown, the base 159 furnished with the diaphragm 10 and the diaphragm holding member 155 are bonded or snugly fit together with an adhesive or double-sided tape capable of vacuum sealing.

The diaphragm holding member 155 is detachably fixed to the lower surface side of the ceiling board of the second enclosure 121 with a vacuum sealing member interposed therebetween. The diaphragm 10 is made as thin as several nm to tens of μm in view of the requirement that the electron beam be allowed to permeate therethrough. Being formed very thin, the diaphragm 10 can break over time or during preparation of observation. Also, the diaphragm 10 is so thin that it is very difficult to handle directly. Because this embodiment allows the base 159 fitted with the diaphragm 10 to be handled not directly but by means of the diaphragm holding member 155, it is appreciably easy to deal with the diaphragm 10 (especially its replacement). That is, when the diaphragm 10 is broken, it may be replaced altogether with the diaphragm holding member 155. In case only the diaphragm 10 needs to be replaced, the diaphragm holding member 155 may be first detached from the apparatus and then the diaphragm 10 may be replaced outside the apparatus.

When the inside of the first enclosure is in a vacuum state, the diaphragm holding member 155 is attracted to the vacuum so that it is stuck to the second enclosure 121 and will not fall. When the inside of the first enclosure is at atmospheric pressure, the diaphragm holding member 155 can be prevented from falling by use of a fall prevention member 203.

<About the Sample Stage>

Installed inside the second enclosure 121 is the sample stage 5 which carries the sample and which can be changed in position. The sample stage 5 is located between the charged particle optical tube 2 and the optical microscope 250 and can be moved independently thereof. The sample stage 5 is provided with an X-Y drive mechanism for movement in the plane direction and a Z-axis drive mechanism for movement in the height direction. In the second enclosure, there is provided a stage support base 17 serving as a base plate for supporting the sample stage 5. The sample stage 5 is mounted on the stage support base 17. The Z-axis drive mechanism and the X-Y drive mechanism are installed in the second enclosure. By manipulating operation knobs 204 for operating these mechanisms, the apparatus user adjusts the position of the sample 6 in the second enclosure 121. Although the operation knobs 204 are shown inside the second enclosure in the drawing, they may alternatively be drawn out of the apparatus or may be controlled by electric motors or the like from the outside. If the stage is significantly large or shaped in such a manner that it cannot be fully accommodated inside the second enclosure 121, at least part of the drive mechanisms including the stage need only be installed in the second enclosure 121.

A platform holder 205 is mounted on the sample stage 5. Upon replacement of the sample, the sample 6 and a sample carrying plate 206 are removed together with the platform holder 205. Then the sample carrying plate 206 fitted with another sample 6 is placed on the platform holder 205 that is then set on the sample stage 5.

The sample 6 is placed on the sample carrying plate 206. The first embodiment has the optical microscope 250 installed in the second enclosure in a manner allowing the sample 6 to be observed from below in the drawing, as will be discussed later. Thus an opening or cutout substantially equal in size to the tip of an objective lens 252 of the optical microscope 250 is provided approximately in the middle of the sample stage 5 and of the platform holder 205 placed thereon so that the objective lens 252 may move close to the sample 6 or to the sample carrying plate 206. The sample carrying plate 206 is made of a transparent material such as a glass slide or plastic so that observations can be made from below in the drawing with the optical microscope 250.

Whereas it was explained above that the sample carrying plate 206 is placed on the platform holder 205, the platform holder 205 is not necessary if the sample carrying plate 205 on which the sample 6 is set can be mounted directly on the sample stage 5.

<About the Optical Microscope>

The optical microscope 250 is explained next. In the first embodiment, the optical microscope 250 is installed in a space on the opposite side of the charged particle optical tube 2 across the diaphragm 10 and the sample 6. The optical microscope 250 is furnished with optical lenses including the objective lens 252. Microscopic information past the optical lenses is transmitted to a CCD camera 254 installed inside the second enclosure. The CCD camera 254 plays the role of a signal formation unit that converts optical information into digital signals such as electrical information. The image information converted to the electrical information by the CCD camera 254 is transmitted to the control units via a signal line 45 for display on the monitor. Obviously, the CCD camera may be replaced with any other suitable imaging device.

The optical microscope 250 is provided with an optical lens drive mechanism 253 for changing the magnification of the sample 6 being observed. The optical lens drive mechanism 253 can move the objective lens 252 in the direction of an optical axis 251 of the optical microscope so as to optically focus on the sample 6 on the sample carrying plate 206. Alternatively, not the objective lens 252 but the optical lenses inside the optical microscope 250, not shown, may be moved in the direction of the optical 251 to change the focus.

The optical microscope 250 is located above the stage support base 17 and under the sample stage 5. That is, even as the sample 6 on the sample stage 5 is moved, the optical microscope 250 remains positionally unchanged relative to the optical axis of the charged particle beam microscope. For this reason, it is possible to adjust the position of the sample for observation by adjusting only the position of the sample while keeping the charged particle microscope and the optical microscope aligned with each other in optical axis.

<About the Light Source>

Figure 3:
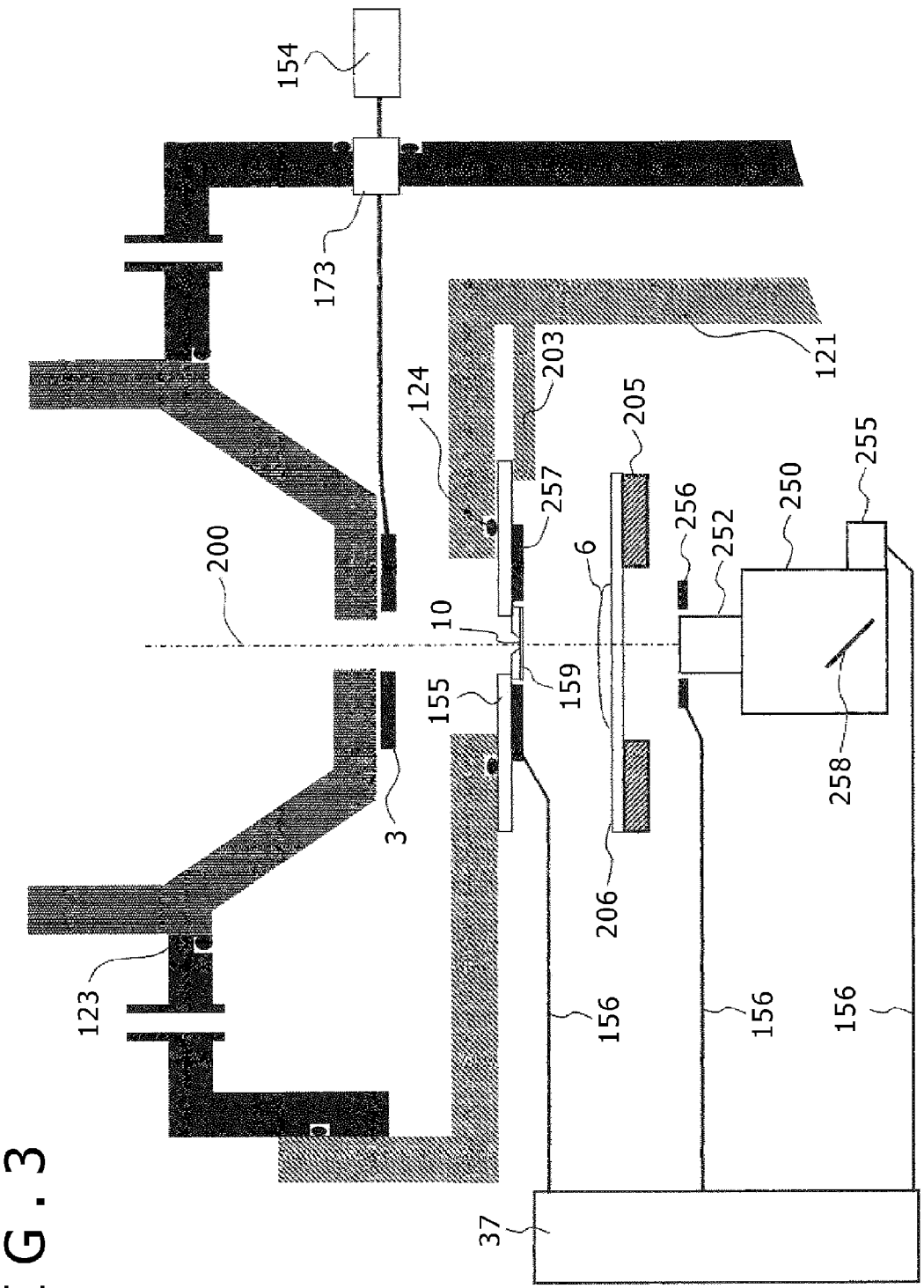
FIG. 3 is an explanatory diagram explaining a light source of the charged particle microscope as the first embodiment.

Explained below with reference to FIG. 3 is the location of installation of the light source for illuminating the sample to obtain optical microscopic images thereof. As a first example, there is the method of using a light source 255 incorporated in the optical microscope 250. In this case, the light emitted from the light source 255 travels past an internal mirror 258, among others, inside the optical microscope 250 before reaching the sample 6 on the transparent sample carrying plate 206. As a second example, there is the method of using a light source 256 located near the objective lens 252 of the optical microscope 250. As a third example, there is the method of using a light source 257 positioned above the sample. In the drawing, the light source 257 is located above the diaphragm holding member 155. Alternatively, the light source 257 may be installed in the second enclosure 121. In the first and the second examples, a reflection type optical microscopic image is obtained using the light reflected from the sample 6 upon illumination from below. In the third example, a transmission type optical microscopic image is acquired using the light passing through the sample 6 from above. Any of these images may be used depending on the information required.

The light source is connected typically to the slave control unit 37 via a communication line 156. The amount of light and the ON/OFF of illumination are controlled by way of the communication line 156. An optical fiber line may be used instead for optical transmission.

In the drawing, the light sources are shown set in all the three locations explained above. However, at least one light source need only be provided. The three light sources explained as examples above may be located elsewhere. Varying locations of these light sources fall within the scope of the SEM or the charged particle beam microscope of the first embodiment as long as such variations fulfill the functions intended by this embodiment.

<About Position Adjustment of the Diaphragm>

Explained next is a position adjustment mechanism for the diaphragm 10. In some cases, the optical axis 200 of the charged particle optical tube 2 (i.e., image center) may be misaligned with the position of the diaphragm 10 when a member fitted with the diaphragm is attached to the second enclosure 121. If the image obtained with the charged particle microscope is not centered substantially, the diaphragm 10 and the sample 6 may not be observed when the magnification of the charged particle beam image is changed. This requires roughly aligning the optical axis 200 of the charged particle optical tube 2 with a diaphragm center 201. In the ensuing paragraphs, the position of the optical axis 200 of the charged particle optical tube 2 is assumed to be fixed.

To align the optical axis 200 of the charged particle optical tube 2 with the position of the diaphragm 10, a diaphragm position adjustment mechanism 259 is used, which can adjust the diaphragm position. FIG. 1 shows a structure in which the diaphragm position adjustment mechanism 259 is located on the open side of the second enclosure 121. For example, with its knob suitably turned, the diaphragm position adjustment mechanism 259 pushes or pulls the diaphragm 10 to adjust the diaphragm position. The diaphragm position adjustment mechanism 259 is secured to the second enclosure 121 by means of a support part 261. In the drawing, only one diaphragm position adjustment mechanism 259 is shown. Since the diaphragm also needs to be moved in the depth direction of the drawing, at least two diaphragm position adjustment mechanisms 259 are required.

When the diaphragm position adjustment mechanisms 259 are operated, the diaphragm holding member 155 fitted with the diaphragm 10 and base 159 is adjusted accordingly in position. Upon position change, the diaphragm holding member 155 is moved in sliding fashion over the vacuum sealing member 124 such as vacuum seals. The diaphragm holding member 155 may also be driven along rails, guides or the like, not shown.

Figure 4:
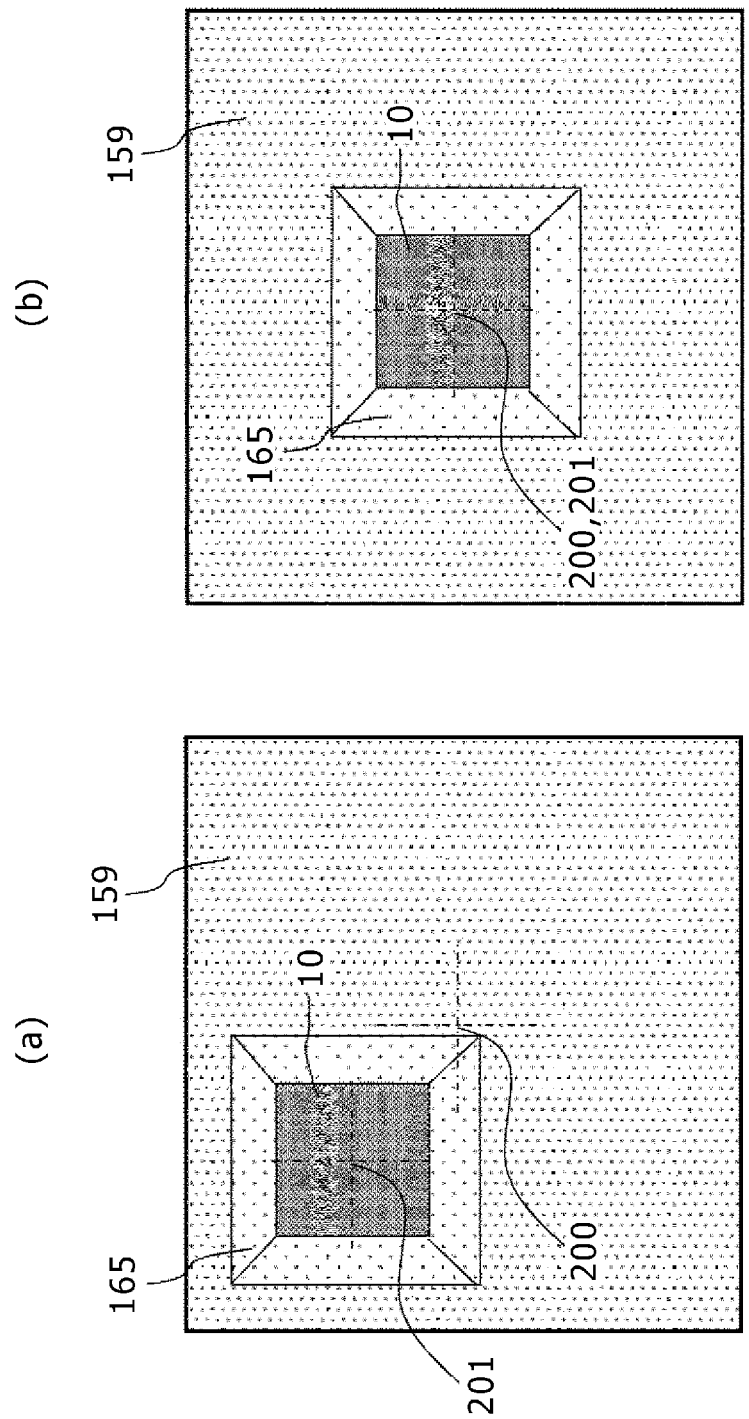
FIGS. 4(A) and 4(B) are diagrams explaining adjustment of the position of the diaphragm.

Explained here with reference to FIG. 4 is how the charged particle beam image appears before and after the position of the diaphragm 10 is changed. If the center 201 of the diaphragm 10 is not aligned with the optical axis 200 of the charged particle optical tube 2, the state such as one shown in FIG. 4(a) takes place. When the diaphragm position adjustment mechanisms 259 are used to move the position of the diaphragm 10 in the X and Y directions, the center 201 of the diaphragm 10 can be aligned with the optical axis 200 of the charged particle optical tube 2, as shown in FIG. 4(b).

<About Position Adjustment of the Optical Microscope>

Explained next is the position adjustment mechanism of the optical microscope 250. The optical microscope 250 permits acquisition of information such as colors, interfering light and fluorescence unique to the optical microscope. On the other hand, the charged particle microscope permits acquisition of information such as surface information, element information and density information specific to the charged particle microscope. Thus if the position of observation under the optical axis 200 of the charged particle optical tube 2 is made the same as the position of observation under the optical axis 251 of the optical microscope 250 in the apparatus of the first embodiment, the above-described items of information about the same spot of the sample 6 can be obtained simultaneously. That is, adjustments need only be made to align the optical axis of the charged particle optical tube 2 with that of the optical microscope 250. Although there may be cases where the optical system of the optical microscope 250 includes mirrors and related parts so that the optical axis is not linear, at least part of the optical axis of the optical microscope need only be on an extension of the optical axis of the charged particle optical tube.

When the optical microscope 250 is installed for the first time in the second enclosure, the optical axis 251 of the optical microscope may not be aligned with the optical axis 200 of the charged particle optical tube 2. In this case, an optical axis adjustment mechanism 260 is needed to adjust the misalignment. The optical axis adjustment mechanism 260 is easy to handle when positioned on the open side of the second enclosure 120. In the drawing, only one optical axis adjustment mechanism 260 is shown. Since the optical axis also needs to be moved in the depth direction of the drawing, at least two kinds of optical axis adjustment mechanisms 260 are required.

The optical axis adjustment mechanisms 260 serve to adjust the entire position of the optical microscope 250. If a base 263 on which the optical microscope 250 is mounted has guides, rails or like mechanisms, they allow the optical microscope 250 to be driven smoothly upon position adjustment.

Once the optical microscope 250 is adjusted in position by use of the optical axis adjustment mechanisms 260, the position is not misaligned upon replacement of the sample 6 or of the diaphragm 10. It follows that the optical axis adjustment mechanisms 260 are not required to remain installed all the time. Following the position adjustment carried out upon installation or assembly of the apparatus, the optical microscope 250 need only be fixed in position. That is, in the drawing, the optical axis adjustment mechanisms 260 may double as fixing mechanisms. As long as the functions intended by the first embodiment are satisfied, the shape and the location of installation of the optical axis adjustment mechanisms doubling as the fixing mechanisms may not be as illustrated in the drawing.

Figure 5:
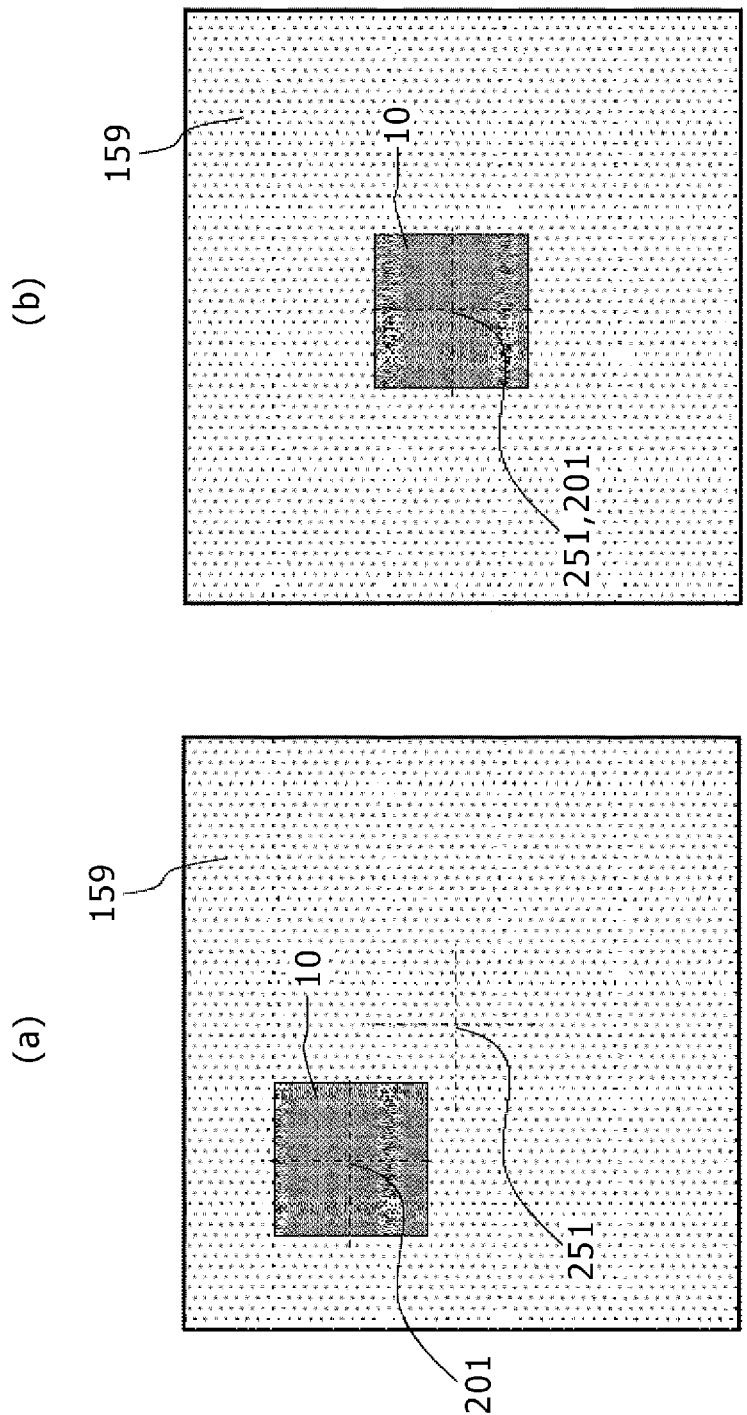
FIGS. 5(A) and 5(B) are diagrams explaining adjustment of the position of an optical microscope.

Explained here with reference to FIG. 5 is how the optical microscope 250 behaves before and after its position is adjusted. Upon image acquisition by the optical microscope, the diaphragm 10 is observed from its lower side in FIG. 1, so that the tapered part 165 is not observed. First, consider the case where the center position of the diaphragm 10 is not aligned with the optical axis 251 of the optical microscope 250. In this case, the optical microscopic image is as shown in FIG. 5(a). The step for adjusting the position of the optical microscope is performed after the step for aligning the optical axis of the charged particle optical tube with the diaphragm center is carried out. In this state, the adjustment of the optical axis of the charged particle optical tube to the diaphragm center has been completed, so that they are substantially aligned with each other. Thus the diaphragm 10 is not moved from the state of FIG. 5(a). Instead, the position of the optical microscope is aligned with the diaphragm center in such a manner that the diaphragm center is adjusted to be positioned on an extension of the optical axis of the optical microscope.

When the optical axis adjustment mechanisms 260 are used to adjust the position of the optical microscope 250 in the X and Y directions, the diaphragm 10 can be positioned at the image center as shown in FIG. 5(b). In this manner, the optical microscope 250 can be moved independently of the charged particle optical tube 2 and diaphragm 10. In the state of FIG. 5(b), the center of the diaphragm 10 is positioned on the optical axis of the optical microscope; the optical axis of the optical microscope is aligned with that of the charged particle optical tube; and the center position of the diaphragm 10 is positioned on these optical axes.

<About Position Adjustment of the Sample>

Figure 6:
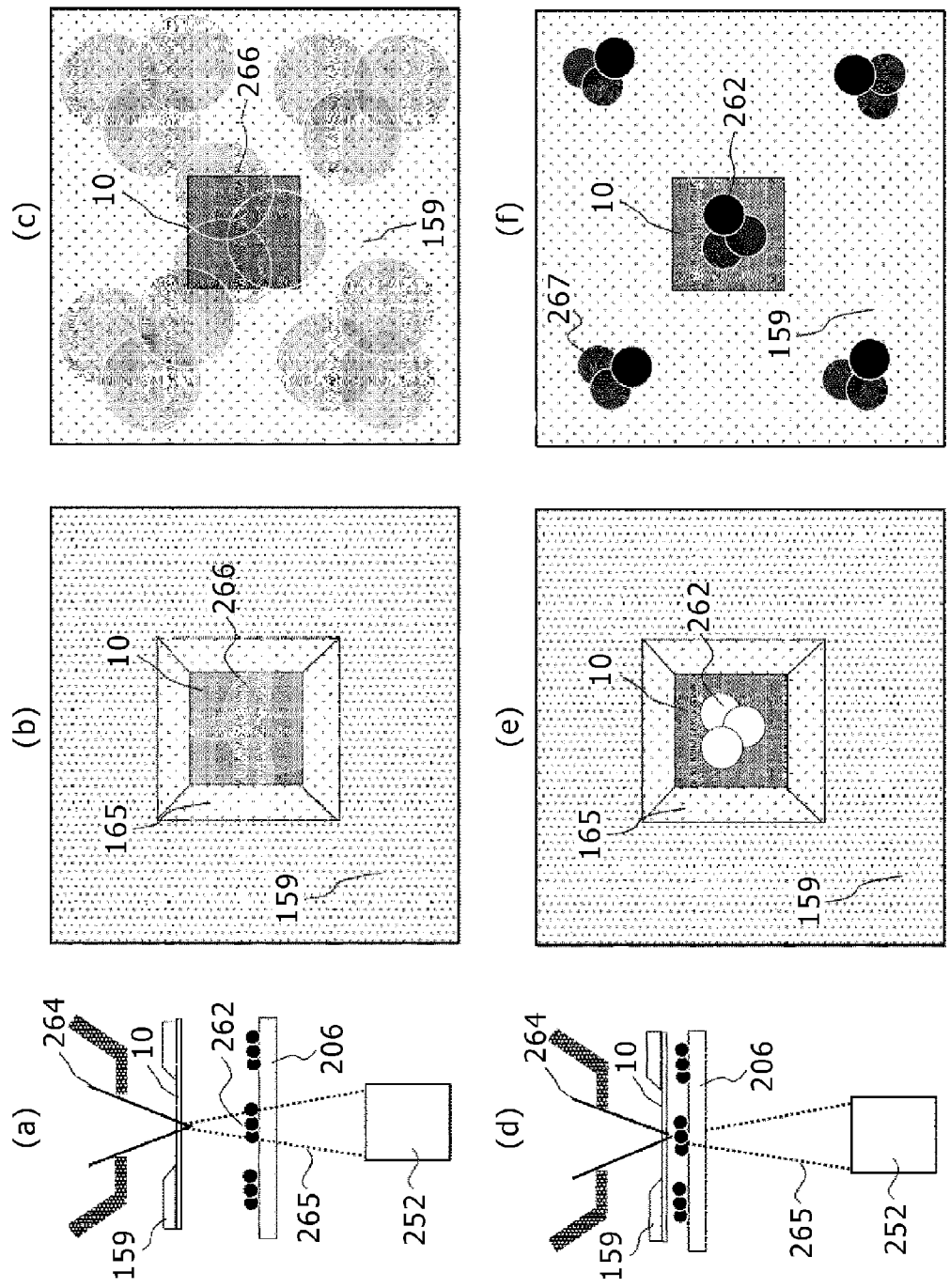
FIGS. 6(A)-6(F) are diagrams explaining images obtained when a sample is moved in the optical axis direction.

Explained next with reference to FIG. 6 is a method for observing a particulate sample 262 on the sample carrying plate 206. In the ensuing paragraphs, it is assumed that the optical axis 200 of the charged particle microscopic image, the center position of the diaphragm 10, and the optical axis 251 of the optical microscopic image are aligned with one another. It is also assumed that the particulate sample 262 is positioned on the sample carrying plate 206 and below the diaphragm 10. FIG. 6(a) is a schematic layout plan showing the focal position of the charged particle microscope, the focal position of the optical microscope, sample, and diaphragm 10. It is further assumed that a focal point 264 formed by the charged particle microscope and a focal point 265 formed by the optical microscope are positioned close to the diaphragm 10. It is also assumed that the particulate sample 262 on the sample carrying plate 206 is located away from the diaphragm 10 and that the particulate sample 262 is not in any of the above-mentioned focal positions. This is a state often brought about immediately after the sample is replaced, for example. In this state, the charged particle microscopic image is as shown in FIG. 6(b) and the optical microscopic image is as indicated in FIG. 6(c). That is, they are both blurred sample images. When the sample position is moved close to the diaphragm 10 by the sample stage 5 as shown in FIG. 6(d), the charged particle microscopic image becomes as shown in FIG. 6(e) and the optical microscopic image becomes as indicated in FIG. 6(f). That is, the two images are both focused on the particulate sample 262. In this manner, the same spot of the particulate sample 206 on the sample carrying plate 206 can be observed with the charged particle microscope and optical microscope.

If it is desired to observe the particulate sample 267 using the charged particle microscope, the sample stage 5 may be moved simply to position the particulate sample 267 to the image center. Then the particulate sample 267 can be observed with the charged particle microscope. That is, the optical microscope 250 allows the position of the particulate sample 267 to be verified so that the sample stage may be driven so as to let the particulate sample 267, of which the position has been checked with the optical microscopic image, come under the diaphragm 10. Thereafter, the particulate sample 267 can be observed with the charged particle beam microscope. That is, whereas the observation with the charged particle microscope limits the field of vision for sample observation to the range of the diaphragm 10, the optical microscope can observe the state of the sample in the vicinity of the diaphragm. For this reason, the optical microscope 250 can be used to find the field of vision for low-magnification observation and to verify the sample position.

At this point, the sample stage 5 can be moved independently of the optical microscope 250, charged particle optical tube 2, and diaphragm 10. This makes it possible to change the observation position of the sample without disturbing the optical axis adjusted as discussed above.

While the diaphragm 10, sample 6, and optical microscope 250 are kept out of contact with each other, the structure of the first embodiment permits observation of the same spot simultaneously by the charged particle beam microscope and the optical microscope. It is thus possible to implement a charged particle microscope that permits observation at atmospheric pressure or at gas pressures more easily than before.

Second Embodiment

Figure 7:
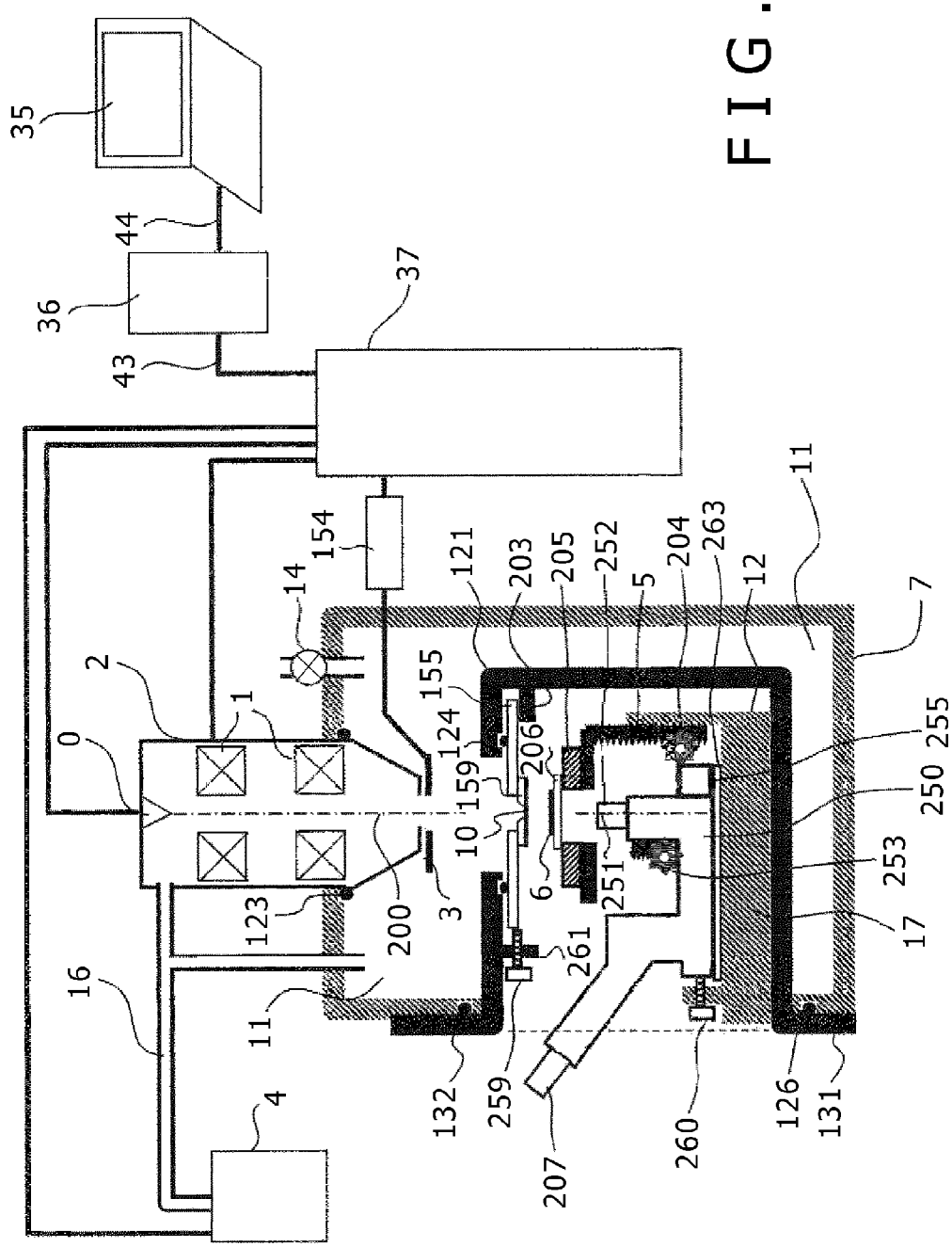
FIG. 7 is an overall block diagram of a charged particle microscope as a second embodiment of the present invention.

The second embodiment is explained with reference to FIG. 7 in conjunction with an apparatus structure furnished with an optical microscope that has an eye lens 207 (observation part) permitting direct visual observation. The operations and functions of the components involved as well as the elements added thereto are substantially the same as those of the first embodiment and thus will not be discussed further in detail.

In this case, an image acquired through the objective lens 252 is projected onto the eye lens 207 by way of the optical lenses inside the optical microscope.

The eye lens is positioned outside a boundary line (dotted line in the drawing) separating the second enclosure 121 from the apparatus exterior. This structure permits verification, from outside the apparatus, of the state of the sample 6 and diaphragm 10 inside the second enclosure 121. The position adjustment mechanisms and observation procedures of the optical microscope are the same as those discussed above. The second embodiment has no need for an expensive CCD camera 254 and entails reduced electrical wiring, so that it offers the advantage of lowered apparatus costs.

Third Embodiment

Figure 8:
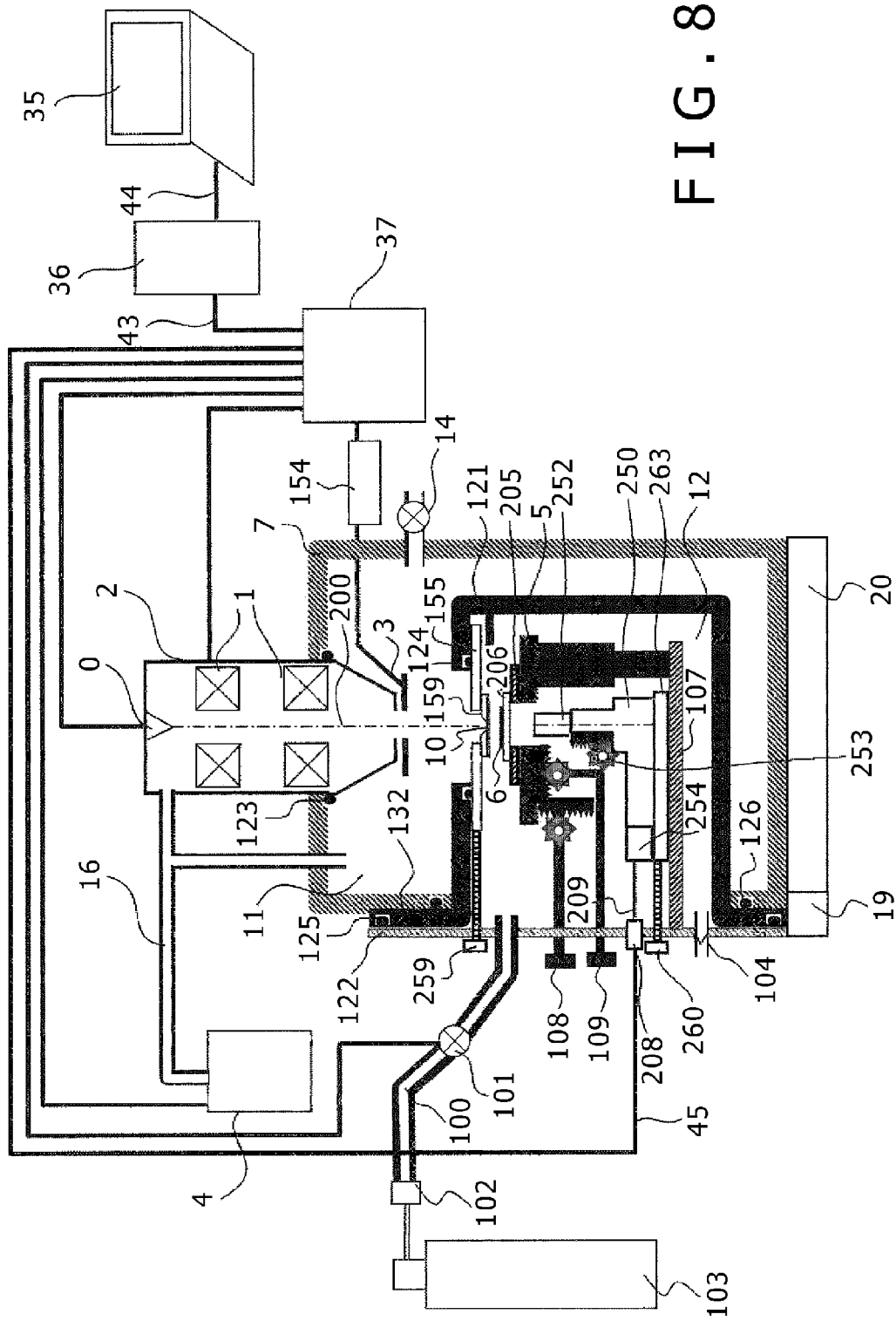
FIG. 8 is an overall block diagram of a charged particle microscope as a third embodiment of the present invention.

The third embodiment is explained using, as an example, a charged particle microscope including a gas introduction mechanism. FIG. 8 is an overall block diagram showing the charged particle microscope as the third embodiment. As with the first embodiment, the charged particle microscope of the third embodiment is made up of a charged particle optical tube 2, a first enclosure (vacuum chamber) 7 that supports the charged particle optical tube against an apparatus installation surface, a second enclosure 121 (attachment) inserted into the first enclosure 7 when used, and a control system. The operations and functions of these components as well as the elements added thereto are substantially the same as those of the first embodiment and thus will not be discussed further in detail.

In the case of the charged particle microscope of the third embodiment, the open side of the second enclosure 121 constituting at least one of the sides thereof can be covered with a cover part 122, so that various functions may be implemented. These functions are explained below.

<About the Atmosphere Near the Sample>

The charged particle microscope of the third embodiment has the function of feeding a shift gas into the second enclosure or generating a pressure state different from the first space in the second enclosure. The electron beam discharged from the lower end of the charged particle optical tube 2 passes through the first space maintained in a high-vacuum state to permeate the diaphragm 10 shown in FIG. 8, before entering the second space kept at atmospheric pressure or at a slightly negative pressure. That is, the second space is in a lower-vacuum state (i.e., with a lower degree of vacuum) than the first space. The mean free path of an electron beam is shortened in the atmospheric space because the electrons are scattered by gas molecules therein. That is, if there is a long distance between the diaphragm 10 and the sample 6, the electron beam, or secondary electrons, reflected electrons or transmission electrons stemming from the emitted electron beam fail to reach the sample or the detectors 3 and 151. Meanwhile, the scattering probability of the electron beam is proportional to the mass number and density of gas molecules. Thus if the second space 12 is filled with gas molecules having a smaller mass number than the air or if the second space 12 is slightly evacuated, the scattering probability of the electron beam declines and the electron beam can reach the sample. The second space need not be entirely filled with a shift gas; at least the air along the passing path of the electron beam in the second space, i.e., in a space between the diaphragm and the sample, need only be replaced with the shift gas. Varieties of the shift gas include nitrogen and water vapor, which are lighter than the air and prove to be effective in improving the S/N ratio of images. However, a gas with a smaller mass such as helium gas or hydrogen gas is more effective in improving the image S/N ratio.

For the above reasons, the charged particle microscope of the third embodiment has the cover part 122 including an attaching part (gas introduction part) for a gas feed pipe 100. The gas feed pipe 100 is coupled to a gas cylinder 103 via a coupling portion 102, which allows the shift gas to be introduced into the second space 12. Halfway along the gas feed pipe 100, there is provided a gas control valve 101 that controls the flow rate of the shift gas flowing through the pipe. For control purposes, a signal line is extended from the gas control valve 101 to the slave control unit 37. The apparatus user can control the flow rate of the shift gas through an operation screen displayed on the monitor of a computer 35. Alternatively, the gas control valve 101 may be opened and closed manually.

Since the shift gas is a light element gas, it tends to stay in the upper region of the second space 12; it is difficult to fill the lower region of the second space 12 with the shift gas. This bottleneck may be bypassed by providing the cover part 122 with an opening for communicating the inside and the outside of the second space at a location lower than the mounting position of the gas feed pipe 100. In FIG. 8, for example, the opening is provided in the location to which a pressure regulating valve 104 is attached. This arrangement causes the atmospheric gas to be discharged from the lower side opening under pressure of the light element gas introduced through the gas introduction part, so that the second enclosure 121 is filled with the gas efficiently. Incidentally, this opening may double as a rough exhaust port, to be discussed later.

Even if the light element gas such as helium gas is used, there may be significant scattering of the electron beam therein. In such a case, the gas cylinder 103 may be replaced with a vacuum pump. Then the inside of the second enclosure is slightly evacuated, which can bring about a very low vacuum state (i.e., an atmosphere at a pressure close to atmospheric pressure) in the second enclosure. For example, an evacuation port provided on the second enclosure 121 or on the cover part 122 may be used to evacuate the inside of the second enclosure 121 first. Then the shift gas may be introduced into the second enclosure 121. In this case, high-vacuum evacuation is not needed; low-vacuum evacuation is sufficient for lowering the atmospheric gas components remaining inside the second enclosure 121 to a predetermined level or less.

However, if the sample is a biological sample or the like that contains moisture, the contained moisture evaporates once the sample is placed in a vacuum state so that the state of the sample is changed. In this case, the shift gas should preferably be introduced directly from the air atmosphere as explained above. When the above-mentioned opening is closed with the cover part following introduction of the shift gas, the shift gas may be effectively contained within the second space.

With the third embodiment, as explained above, it is possible to control the space in which the sample is placed to desired degrees of vacuum ranging from atmospheric pressure (about $10^5$ Pa) to about $10^3$ Pa. In the ordinary, so-called low-vacuum scanning electron microscope, the electron beam column communicates with the sample chamber. It follows that lowering the degree of vacuum in the sample chamber close to atmospheric pressure entails varying the pressure inside the electron beam column correspondingly. It has thus been difficult to control the sample chamber to pressures ranging from atmospheric pressure (about $10^5$ Pa) to about $10^3$ Pa. According to the third embodiment, by contrast, the diaphragm isolates the second space from the first space, so that the pressure and type of the gas in the second space enclosed by the second enclosure 121 and cover part 122 can be freely controlled. This makes it possible to control the sample chamber to pressures ranging from atmospheric pressure (about $10^5$ Pa) to about $10^3$ Pa—something that has been difficult to achieve in the past. Moreover, the state of the sample can be observed not only at atmospheric pressure (about $10^5$ Pa) but also under continuously varying pressures close thereto.

If a three-way valve is attached to the location of the above-mentioned opening, this opening may double as a rough exhaust port and an air leak exhaust port. Specifically, one port of the three-way valve is coupled to the cover part 122, another port to a vacuum pump for rough exhaust, and another port to a leak valve. The dual-purpose exhaust port mentioned above can be implemented in this manner.

In place of the opening above, the pressure regulating valve 104 may be provided. The pressure regulating valve 104 has the function of automatically opening if the pressure inside the second enclosure 121 becomes higher than atmospheric pressure. If the internal pressure gets higher than atmospheric pressure during introduction of a light element gas, the pressure regulating valve having this function automatically opens to release the atmospheric gas components such as nitrogen and oxygen into the outside of the apparatus and thereby fill the inside of the apparatus with the light element gas. Incidentally, the gas cylinder or vacuum pump 103 shown in the drawing may be attached to the charged particle microscope either during manufacturing or later by the apparatus user.

<About the Sample Stage>

How to adjust the position of the sample 6 with the third embodiment is explained next. The charged particle microscope of the third embodiment has the sample stage 5 as a means for moving the field of observation. The sample stage 5 is provided with an X-Y drive mechanism for movement in the plane direction and a Z-axis drive mechanism for movement in the height direction. The cover part 122 is furnished with a support plate 107 that serves as a base plate for supporting the sample stage 5. The sample stage 5 is fixed to the support plate 107. The support plate 107 is installed in such a manner as to extend toward the opposite surface of the second enclosure 121 from the cover part 122 and into the inside of the second enclosure 121. Support shafts extend from the Z-axis drive mechanism and X-Y drive mechanism, each of the shafts being coupled with operation knobs 108 and 109 that belong to the cover part 122. By manipulating the operation knobs 108 and 109, the apparatus user adjusts the position of the sample 6 inside the second enclosure 121.

<About the Optical Microscope>

The optical microscope 250 is installed inside the second enclosure 121. A microscopic image acquired through the objective lens 252 provided in the optical microscope 250 is sent to the CCD camera 254. Following conversion to an electrical signal by the CCD camera 254, the signal is transmitted to the slave control unit 37 via wiring 209 and past a wiring connection part 208. Although the CCD camera is located inside the second enclosure 121 in the drawing, the CCD camera may alternatively be positioned outside the second enclosure depending on the structure of the optical microscope.

The optical microscope 250 is located above the support plate 107 and under the sample stage 5. That is, even as the sample 6 on the sample stage 5 is moved, the optical microscope 250 remains positionally unchanged. For this reason, it is possible to adjust the position of the sample for observation by adjusting only the position of the sample while keeping the charged particle microscope and the optical microscope set for the same observation.

Although not shown, the light source for forming an optical microscopic image is installed inside the second enclosure 121 and connected to the communication line 156 which, as shown in FIG. 3, is connected typically to the slave control unit 37 via the wiring connection part 208 or an equivalent part on the cover part 122. The wiring connection part 208 plays the role of a signal outlet port or a signal line lead-out port that outputs the signal from the optical microscope to the outside of the second enclosure.

Although there is not shown any mechanism for controlling, from outside the apparatus, the optical lens drive mechanism 253 that drives the optical lenses in the axial direction to change the focal position of the optical microscope, the optical lens drive mechanism 253 can be operated in the axial direction from outside the apparatus by use of operation knobs which are mounted on the cover part 121 and to which several mechanical parts are connected. Alternatively, an electrical motor or the like may be installed inside the second enclosure 121 to control the optical lens drive mechanism 253 via electrical wiring. However, as long as the focal position of the optical microscope 250 is always set near the diaphragm 10, the optical lens drive mechanism 253 need not be controlled every time the apparatus is used. Once the optical lens drive mechanism 253 is adjusted while the cover part 122 is being drawn out of the apparatus as will be discussed later, the optical lens drive mechanism 253 may be left unused.

<About Replacement of the Sample>

Figure 9:
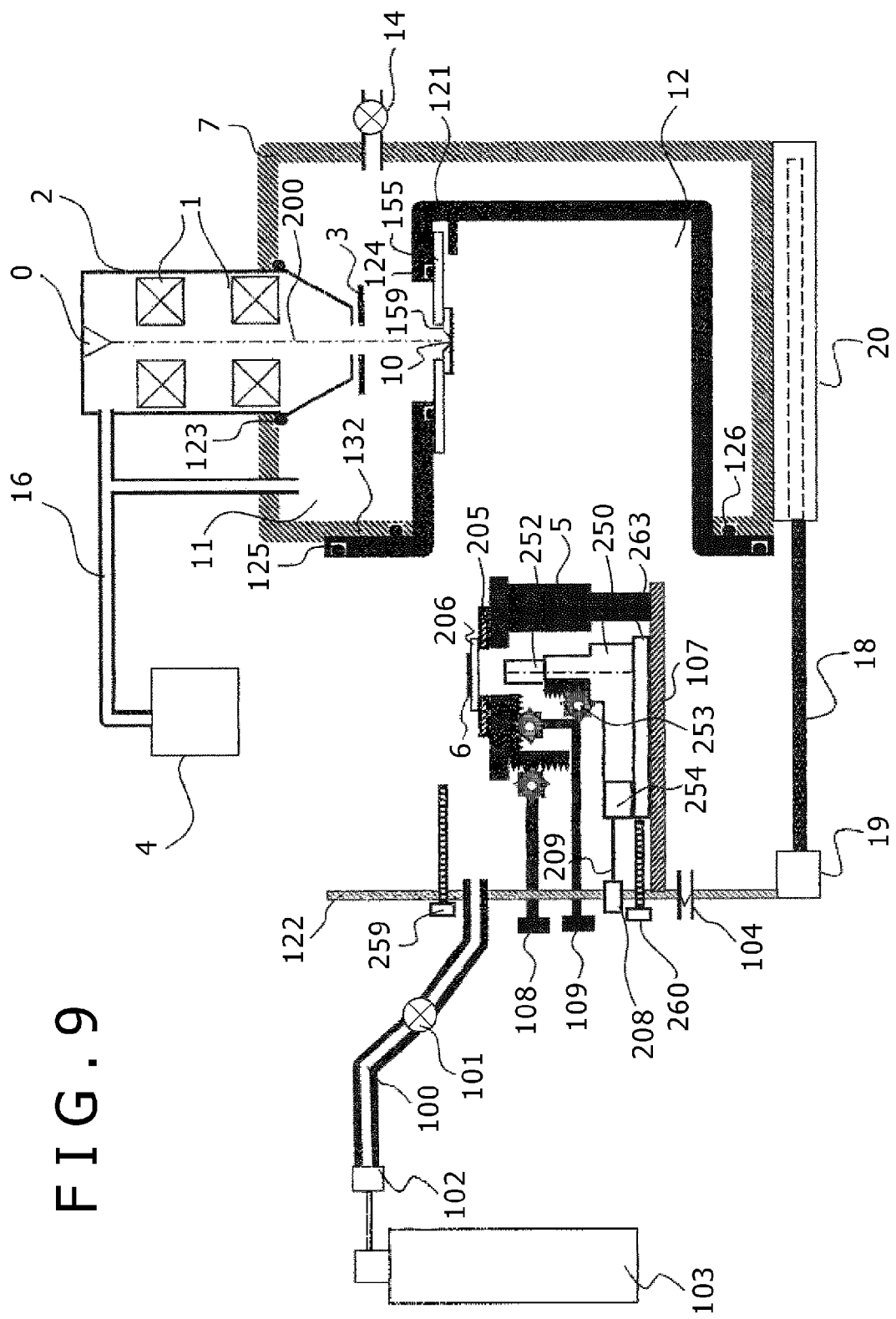
FIG. 9 is a diagram showing how a sample stage is drawn out of the charged particle microscope as the third embodiment.

The mechanisms for replacing the sample 6 are explained next. The charged particle microscope of the third embodiment has a cover part support member 19 and a base plate 20 installed under the bottom of the first enclosure 7 and under the lower surface of the cover part 122, respectively. The cover part 122 is detachably fixed to the second enclosure 121 with a vacuum sealing member 125 interposed therebetween. The cover part support member 19 is also fixed detachably to the base plate 20. As shown in FIG. 9, the cover part 122 and cover part support member 19 can be detached as a whole from the second enclosure 121. In the drawing, electrical wiring is not shown.

The base plate 20 is provided with a support rod 18 for use as a guide upon removal. In the normal state of observation, the support rod 18 is housed in a storage part of the base plate 20. The support rod 18 is structured to extend in the direction in which the cover part 122 is drawn out for removal. Also, the support rod 18 is fixed to the cover part support member 19 so that when the cover part 122 is removed from the second enclosure 121, the cover part 122 will not be completely detached from the body of the charged particle microscope. This arrangement is intended to prevent the sample stage 5 or the sample 6 from falling.

When the cover part 122 is pulled out, the optical microscope 250 is drawn out at the same time. Thus the position of the optical microscope 250 remains unchanged relative to the position of the cover part 122. Also, the position of the cover part 122 remains the same relative to the second enclosure 121, i.e., relative to the diaphragm 10. That is, the relative position between the optical microscope and the diaphragm 10 when the cover part 122 is closed can be maintained. That means there is no need to readjust the position of the optical microscope after the stage is pulled out and then put back into its initial position.

When the sample is to be brought into or out of the second enclosure 121, the operation knob for the Z-axis of the sample stage 5 is first operated to move the sample 6 away from the diaphragm 10. The pressure regulating valve 104 is then opened to expose the inside of the second enclosure to the atmosphere. Thereafter, following the verification that the inside of the second enclosure is neither in a negative pressure state nor in an inordinately pressured state, the cover part 122 is pulled out to the opposite side of the apparatus body. After the sample is replaced, the cover part 122 is pushed into the second enclosure 121. With the cover part 122 fixed to the matching unit 132 using a fastening member, not shown, the inside of the second enclosure 121 is filled with a shift gas or evacuated as needed. The above operations may be carried out while a high voltage is being applied to the optical lens 2 in the charged particle optical tube 2 or the electron beam is being emitted from the charged particle source 0. That is, the operations may be performed while the charged particle optical tube 2 is continuously in operation and while the first space is kept in the vacuum state. The charged particle microscope of the third embodiment thus permits observation to be started quickly after the sample is replaced.

<About the Position Adjustment Mechanism>

The optical axis 200 of the charged particle optical tube 2, the diaphragm 10, and the optical axis 251 of the optical microscope 250 need to be aligned with one another. This requires providing a diaphragm position adjustment mechanism 259 and an optical axis adjustment mechanism 260, as in the case of the first embodiment. The third embodiment is furnished with the cover part 122 for capping the inside of the second enclosure 2. Explained below is a structure in which the diaphragm position adjustment mechanism 259 or the optical axis adjust mechanism 260 may be controlled from outside the second enclosure 121.

As shown in FIG. 8, the cover part 122 has operation parts for the diaphragm position adjustment mechanism 259 and the optical axis adjust mechanism 260. The optical axis adjustment mechanism 260 may be rotated or otherwise operated to slide the optical microscope 250 over or along the base 263 such as guides or rails for position change. Likewise, the diaphragm position adjustment mechanism 259 may be rotated or otherwise operated to slide, over the vacuum sealing member 124, the base 159 or the diaphragm holding member 155 holding the diaphragm 10 for position change. Although one diaphragm position adjustment mechanism 259 and one optical axis adjustment mechanism 260 are shown in the drawing, the positions also need to be adjusted in the depth direction of the drawing, so that at least two kinds of diaphragm position adjustment mechanisms 259 and two kinds of optical axis adjustment mechanisms 260 are required.

As an alternative, the diaphragm position adjustment mechanisms 259 or the optical axis adjustment mechanisms 260 may be installed only inside the second enclosure, not shown. In this case, the optical microscope 250, base 159, or diaphragm holding member 155 is to be changed in position while the cover part 122 is being kept pulled out.

As in the case of the first embodiment, once adjusted positionally by the optical axis adjustment mechanisms 260, the optical microscope 250 remains unchanged in position even when the sample 6 or the diaphragm 10 is changed. For this reason, the optical axis adjustment mechanisms 260 may not be necessary; the optical microscope 250 need only be fixed in position following the position adjustment carried out upon installation or assembly of the apparatus. That is, the optical axis adjustment mechanisms 260 in the drawing may double as fixing mechanisms. As long as the functions intended by the first embodiment are satisfied, the shape and the location of installation of the optical axis adjustment mechanisms doubling as the fixing mechanisms may not be as illustrated in the drawing.

<About Evacuation>

Figure 10:
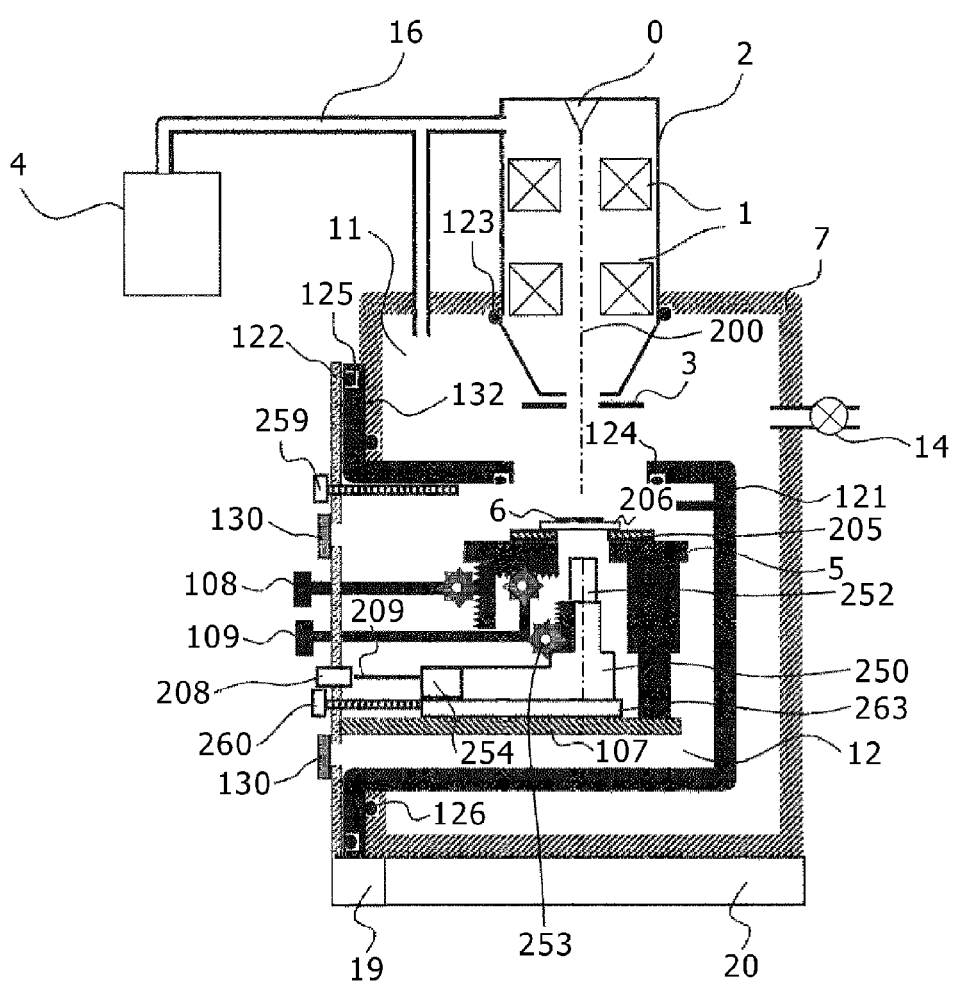
FIG. 10 is a diagram explaining the state in which the diaphragm and other components are detached from the third embodiment.

The charged particle microscope of the third embodiment may also be used as an ordinary high-vacuum SEM. FIG. 10 is an overall block diagram showing the charged particle microscope of the third embodiment used as a high-vacuum SEM. In FIG. 10, the control system is the same as that in FIG. 8 and is not shown. FIG. 10 shows a charged particle microscope in which, with the cover part 122 fixed to the second enclosure 121, the gas feed pipe 100 and pressure regulating valve 104 are detached from the cover part 122 and in which the mounting positions vacated by the gas feed pipe 100 and pressure regulating valve 104 are later covered with cover parts 130. After the diaphragm 10 and diaphragm holding member 155 are detached together with the diaphragm holding member 155 by carrying out the above series of operations, the first space 11 can be connected with the second space 12, allowing the inside of the second enclosure to be evacuated with the vacuum pump 4. This in turn makes it possible to perform high-vacuum SEM observations with the second enclosure 121 kept attached.

The signal from the optical microscope 250 can be output to the outside of the apparatus by way of the CCD camera 254, wiring 209, and wiring connection part 208. The wiring connection part 208 is required to be vacuum-sealed.

<Others>

As explained above, the third embodiment has the sample stage 5, sample stage operation knobs 108 and 109, gas feed pipe 100, and pressure regulating valve 104 attached altogether to the cover part 122. As a result, the apparatus user can remain facing the same side of the first enclosure while manipulating the operation knobs 108 and 109 or working to replace the sample or to attach and detach the gas feed pipe 100 and pressure regulating valve 104. It follows that, compared with the ordinary charged particle microscope in which the above-mentioned components are mounted in a scattered manner on various sides of the sample chamber, the third embodiment offers appreciably enhanced operability.

The above-described structure may be supplemented with a contact monitor for detecting the contact condition between the second enclosure 121 and the cover part 122. This contact monitor may be used to monitor whether the second space is closed or opened.

In addition to the secondary electron detector and the reflected electron detector, there may be provided an X-ray detector and a photodetector capable of EDS analysis and fluorescence line detection. The X-ray detector and photodetector may be installed in either the first space 11 or the second space 12.

A voltage may be applied to the sample stage 5 and detector 151. Applying the voltage to the sample 6 and detector 151 gives high energy to the emission and transmission electrons emanating from the sample 6, which can increase the amount of signals and thereby improve the S/N ratio of images.

As described above, the third embodiment can supplement the effects of the first embodiment by introducing a shift gas starting from atmospheric pressure. This embodiment also allows the sample to be observed in an atmosphere under a pressure different from that of the first space. While permitting observation in the atmosphere or in a predetermined gas atmosphere, the third embodiment also constitutes an SEM providing observation of the sample in the same vacuum state as that of the first space. The charged particle microscope of the third embodiment thus permits acquisition of images with a higher S/N ratio than the charged particle microscope of the first embodiment.

Although the third embodiment has been explained above with emphasis on a structure intended for use as a desktop electron microscope, the third embodiment may also be applied to a large-scale charged particle microscope. Whereas the desktop electron microscope has the entire apparatus or its charged particle optical tube supported by an enclosure on an apparatus installation surface, the large-scale charged particle microscope need only have the entire apparatus placed on a frame. Thus when the first enclosure 7 is placed on the frame, the structure discussed above in connection with the third embodiment can be applied unmodified to the large-scale charged particle microscope.

Fourth Embodiment

Figure 11:
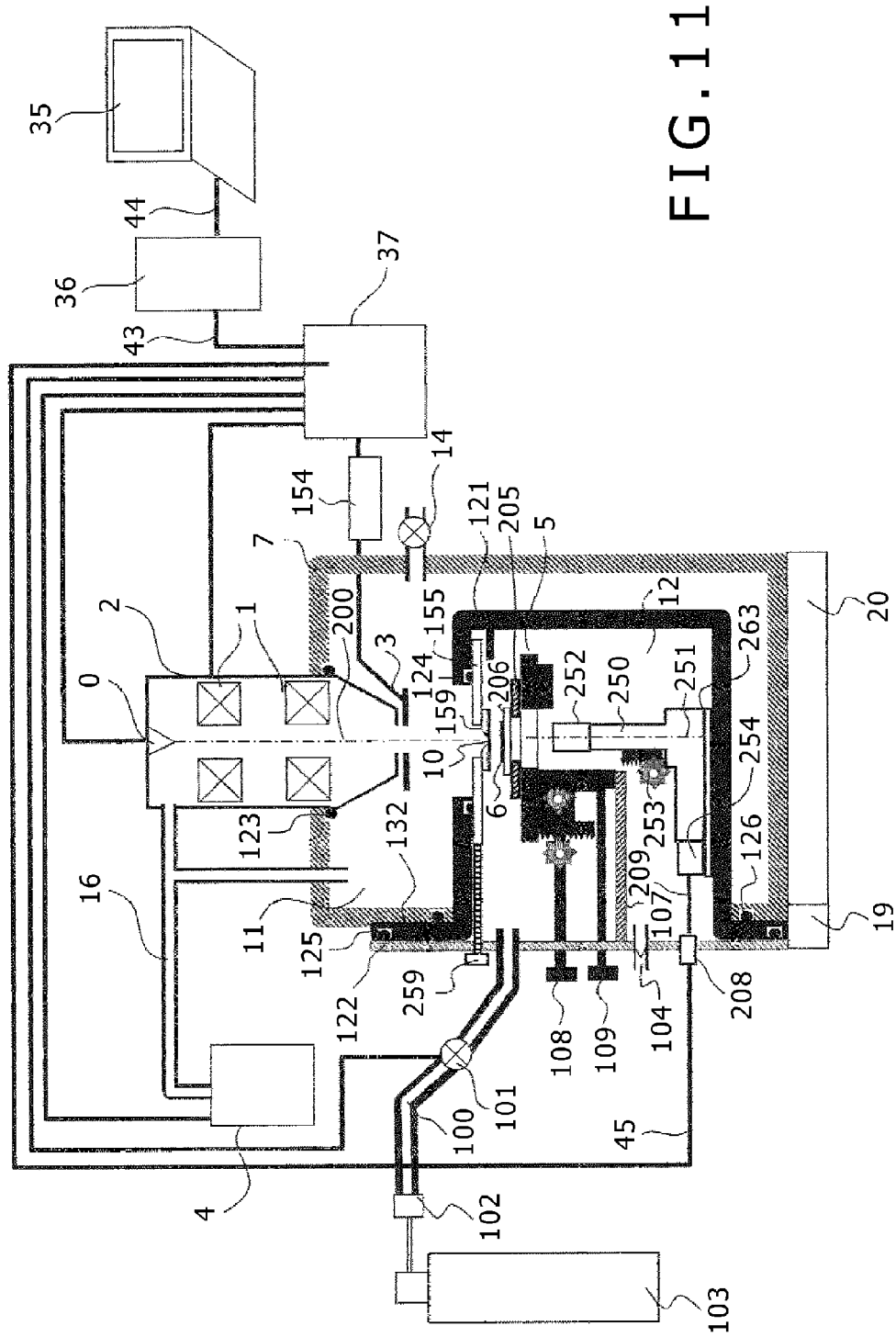
FIG. 11 is an overall block diagram of a charged particle microscope as a fourth embodiment of the present invention.

The fourth embodiment is explained with reference to FIG. 11 in conjunction with a structure in which the optical microscope 250 is separated from the sample stage and attached directly to the second enclosure 121. Those portions of the fourth embodiment which are similar to those of the first through the third embodiments will not be explained hereunder.

The optical microscope is mounted on the base 263 and the stage 5 on the support plate 107. Pulling the cover part 122 out of the apparatus allows the stage 5 to be detached together with the support plate 107, which leaves behind the optical microscope 250 in the second enclosure. The optical microscope 250 may be adjusted in position as follows: with the cover part 122 detached, the center of the observation position of the optical microscope is aligned with the center position of the diaphragm 10 and with the optical axis of the charged particle optical tube 2 as shown in FIG. 5, and the optical microscope may be fixed in position typically by use of the base 263. Likewise, the focal position of the optical microscope and the optical lens drive mechanism 253 are adjusted while the cover part 122 is being pulled out. In this structure, the position of the optical microscope 250 is never changed when the cover part 122 is pulled out upon replacement of the sample. That is, even if the cover part 122, vacuum sealing member 125, or support rod 18 wears or deteriorates, the 3D positional relation between the optical microscope 250 and the diaphragm 10 remains completely unchanged. Compared with the structure in FIG. 8, this structure offers the advantage of requiring the optical microscope 250 to be adjusted less often.

However, while the cover part is being pulled out, the wiring for controlling the optical microscope must be detachable or extendable. That is, the wiring 209 for acquiring image data from the CCD camera 254 and the wiring shown in FIG. 3 for controlling the light sources, not shown, are required to be detachable or extendable.

Fifth Embodiment

The fifth embodiment is explained in conjunction with an apparatus structure in which the optical microscope 250 is secured in a manner detached from the second enclosure and that the image from the optical microscope 250 is not obtained as electrical signals from the CCD camera 254 but is observed directly by the apparatus user utilizing the eye lens 207. The portions of the fifth embodiment that are similar to those of the first through the fourth embodiments will not be explained hereunder.

Figure 12:
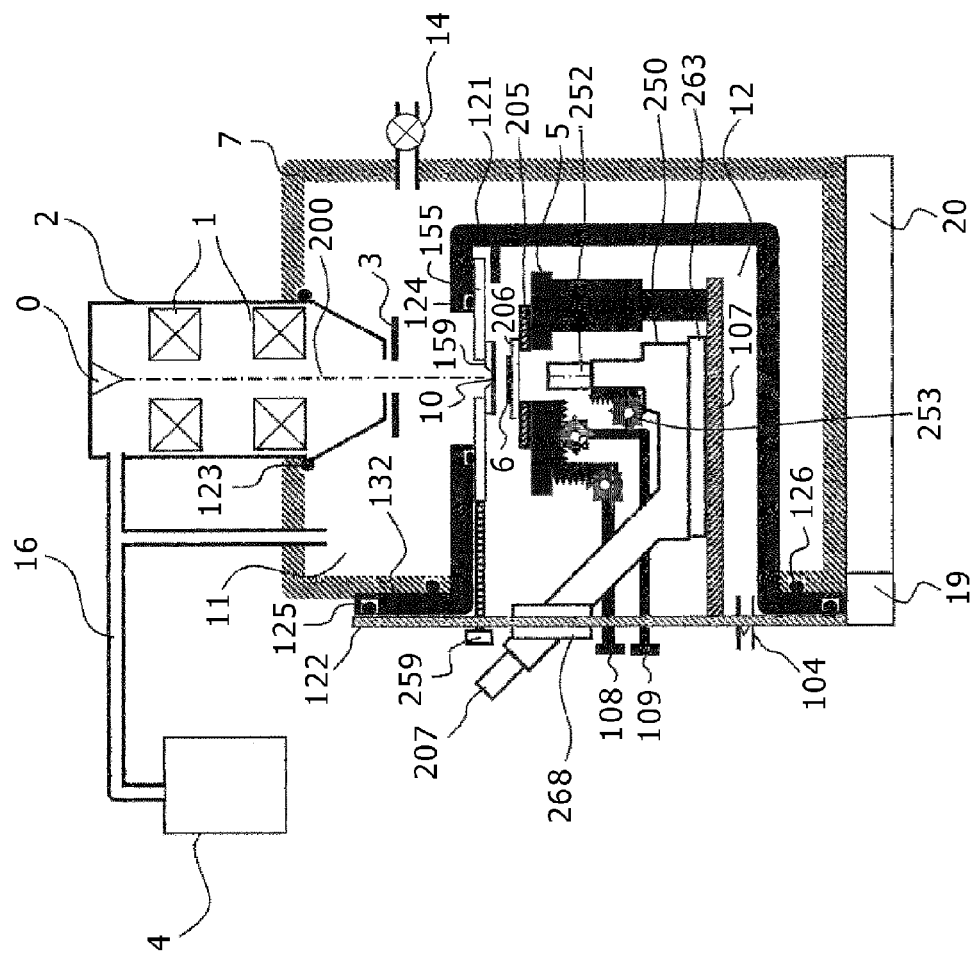
FIG. 12 is an overall block diagram of a charged particle microscope as a fifth embodiment of the present invention.

FIG. 12 is an overall block diagram of the embodiment. Not shown in the drawing are the control system, the gas cylinder for feeding gas into the second enclosure 121, and the pump for evacuating the inside of the second enclosure 121. In this apparatus, microscope signals from the optical microscope 250 reach the eye lens 207 after passing through the internal lenses of the optical microscope 250. Looking into the eye lens 207 can visually verify an optical microscopic image of the sample 6 in the atmospheric state, in a gas atmosphere, or in the vacuum state. As in the case of the third embodiment, pulling out the cover part 122 entails drawing out the optical microscope 250 as well. A coupling part 268 is provided in that portion of the cover part 122 where part of the optical microscope 250 protrudes out of the second enclosure 121. The coupling part 268 allows optical signals from the optical microscope to be transmitted therethrough while maintaining the gas pressure state and the vacuum pressure state inside the second enclosure 121. The fifth embodiment has no need for an expensive CCD camera 254 and entails reduced electrical wiring, so that it offers the advantage of lowered apparatus costs.

Sixth Embodiment

Unlike the preceding embodiments, the sixth embodiment is a variation of the invention that does not have the second enclosure 121. The surroundings of the diaphragm 10, sample stage 5, and optical microscope 250 are substantially the same in structure as those of the first through the fifth embodiments discussed above, so that the ensuing paragraphs will mainly explain what makes the sixth embodiment different from the preceding embodiments.

Figure 13:
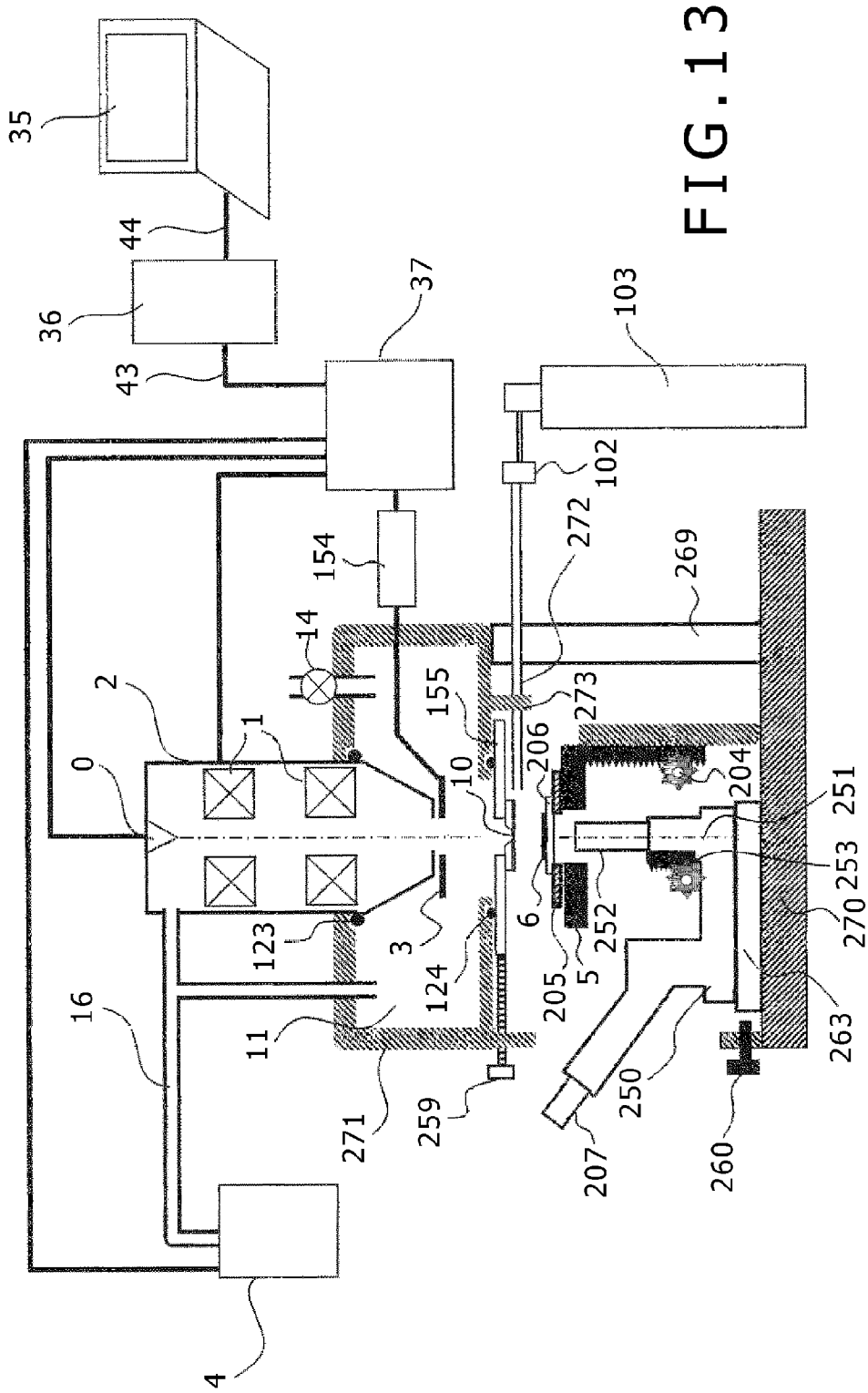
FIG. 13 is an overall block diagram of a charged particle microscope as a sixth embodiment of the present invention.

FIG. 13 shows an overall structure of a charged particle microscope as the sixth embodiment. In this embodiment, the charged particle optical tube 2 is fitted into an enclosure 271 and vacuum-sealed with the vacuum sealing member 123. The enclosure 271 is supported by a column 269 which in turn is supported by a base 270. Whereas only one column 269 is shown in the drawing, multiple columns should preferably be provided in practice to support the enclosure. This structure keeps the atmosphere in which the sample 6 is placed equal to the atmosphere outside the apparatus, so that the sample will be completely exposed to the atmospheric state.

The gas from the gas cylinder 103 is supplied through a gas nozzle 272 oriented toward the surroundings of the sample 6. The gas nozzle 272 is connected to the enclosure 271 by means of a support 273, for example. The gas cylinder 103 and the gas nozzle 272 are coupled with each other using the coupling portion 102. This structure, though only an example, allows a jet of a desired gas to be emitted toward the surroundings of the sample 6. The types of gas that may be used include nitrogen, water vapor, helium gas, and hydrogen gas which are lighter than air and can thus reduce the scattering of the electron beam. The gas type can be changed as desired by the user.

The optical microscope 250 is arranged immediately under the enclosure 271, i.e., in a manner aligned with the optical axis of the charged particle optical tube. This arrangement allows a charged particle beam microscopic image to be obtained by irradiating the sample 6 on the sample stage 5 with the charged particle beam passing through the diaphragm 10, and permits an optical microscopic image to be acquired with the optical microscope 250. The structures such as the diaphragm position adjustment mechanisms 259 for the diaphragm 10, the optical axis adjustment mechanisms 260, and the optical lens drive mechanism 253 for driving the internal lenses of the optical microscope in the direction of the optical axis 251 of the optical microscope 250 are the same as those discussed above in connection with the preceding embodiments.

The structure of the sixth embodiment thus permits observation of the same spot by both the charged particle beam microscope and the optical microscope while the diaphragm 10, sample 6, and optical microscope 250 are kept out of contact with one another.

Seventh Embodiment

The seventh embodiment is explained as an embodiment in which the optical microscope is arranged over the charged particle optical tube and the diaphragm. The basic apparatus structure is substantially the same as that of the first through the sixth embodiments discussed above, so that the portions of the seventh embodiment that are the same as those of the preceding embodiments will not be discussed further.

Figure 14:
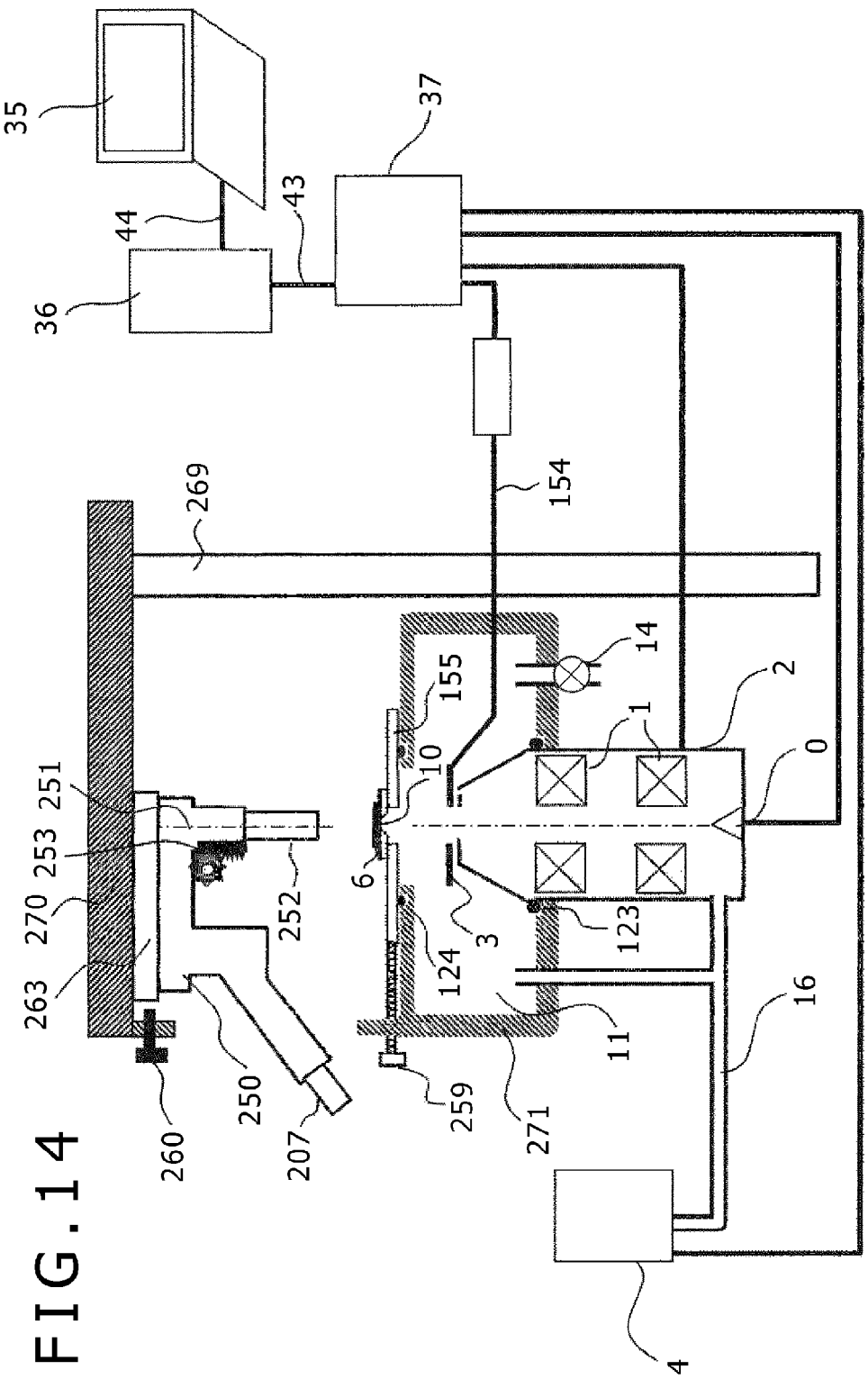
FIG. 14 is an overall block diagram of a charged particle microscope as a seventh embodiment of the present invention.

In the seventh embodiment, as shown in FIG. 14, the sample 6 is placed directly on the diaphragm 10. In this case, unlike in the preceding embodiments, the position of the sample cannot be changed independently of the diaphragm. To change the observation position of the sample thus requires moving the position of the diaphragm relative to the charged particle beam tube by use of the diaphragm position adjustment mechanisms 259.

Although the seventh embodiment has been explained above using an optical microscope including the eye lens 207, it is also possible for this embodiment to make observations using an imaging device such as the CCD camera.

The seventh embodiment also permits observation of the same spot of the sample at atmospheric pressure by the charged particle beam microscope and the optical microscope simultaneously.

The present invention is not limited to the first through the seventh embodiments discussed above and may also be implemented in diverse variations. The embodiments above have been explained as detailed examples helping this invention to be better understood. The present invention, when embodied, is not necessarily limited to any embodiment that includes all the structures described above. Part of the structure of one embodiment may be replaced with the structure of another embodiment. The structure of a given embodiment may be supplemented with the structure of another embodiment. Part of the structure of each embodiment may be supplemented with, emptied of, or replaced by another structure. The above-described structures, functions, processing units, and processing means may be implemented partially or entirely by hardware through integrated circuit design, for example. Also, the above-described structures and functions may be implemented by software in the form of programs which, when interpreted and executed by a processor, bring about the respective functionality.

The programs, tables, files, and other data for implementing the functions may be stored in storage devices such as memories, hard disks and SSD (Solid State Drive), or on recording media such as IC cards, SD cards and DVDs.

The illustrated control lines and data lines are those considered necessary for purpose of explanation and may not represent all control lines and data lines needed in the apparatus as a product. In practice, almost all structures may be considered to be interconnected.

DESCRIPTION OF REFERENCE CHARACTERS

0: Charged particle source
1: Optical lens
2: Charged particle optical tube
3: Detector
4: Vacuum pump
5: Sample stage
6: Sample
7: First enclosure
10: Diaphragm
11: First space
12: Second space
14: Leak valve
16: Vacuum piping
17: Stage support base
18: Support rod
19: Cover part support member
20: Base plate
35: Computer
36: Master control unit
37: Slave control unit
43, 44, 45: Communication line
100: Gas feed pipe
101: Gas control valve
102: Coupling portion
103: Gas cylinder or vacuum pump
104: Pressure regulating valve
107: Support plate
108, 109: Operation knob
121: Second enclosure
122, 130: Cover part
123, 124, 125, 126, 128, 129: Vacuum sealing member
131: Main unit
132: Matching unit
154: Signal amplifier
155: Diaphragm holding member
156, 157, 158: Communication line
159: Base
200: Optical axis of charged particle beam
201: Center of diaphragm
203: Fall prevention member
204: Operation knob
205: Platform holder
206: Sample carrying plate
207: Eye lens
208: Wiring connection part
209: Wiring
250: Optical microscope
251: Optical axis of optical microscope
252: Objective lens
253: Optical lens drive mechanism
254: CCD camera
255, 256, 257: Light source
258: Internal mirror
259: Diaphragm position adjustment mechanism
260: Optical axis adjustment mechanism
261: Support part
262: Particulate sample
263: Base
264: Focal point formed by charged particle microscope
265: Focal point formed by optical microscope
267: Particulate sample
268: Coupling part
269: Column
270: Base
271: Enclosure
272: Gas nozzle
273: Support

The invention claimed is:

1. An observation apparatus comprising:
a charged particle optical tube that irradiates a sample with a primary charged particle beam;
a vacuum pump that evacuates the inside of the charged particle optical tube;
a diaphragm arranged to remain out of contact with the sample and to separate a space in which the sample is placed from the charged particle optical tube, the diaphragm being detachable and allowing the primary charged particle beam to permeate or pass therethrough;
an optical microscope positioned on the opposite side of the charged particle optical tube across the diaphragm and the sample, the optical microscope having an optical axis thereof aligned with at least part of an extension of the optical axis of the charged particle optical tube; and an optical axis adjustment mechanism configured to adjust and fix a position of the optical axis of the optical microscope so that the center of the diaphragm is positioned on the optical axis of the optical microscope.

2. The observation apparatus according to claim 1, wherein the optical axis adjustment mechanism can move the optical microscope independently of the charged particle optical tube and the diaphragm.

3. The observation apparatus according to claim 1, further comprising a stage, wherein the stage can be moved independently of the optical microscope, the charged particle optical tube, and the diaphragm.

4. The observation apparatus according to claim 1, further comprising:

a first enclosure that supports the charged particle beam apparatus as a whole against an apparatus installation surface, the first enclosure having the inside thereof evacuated by the vacuum pump; and a second enclosure of which the position is fixed to a side or an inner wall surface of the first enclosure or to the charged particle optical tube, the second enclosure holding the sample thereinside, wherein:

the diaphragm is located on the upper surface side of the second enclosure; and the pressure inside the second enclosure is kept equal to or higher than the pressure inside the first enclosure.

5. The observation apparatus according to claim 4, further comprising an adjustment mechanism that moves the position of the diaphragm, wherein at least part of the drive mechanism is located inside the second enclosure.

6. The observation apparatus according to claim 4, further comprising a sample stage interposed between the charged particle optical tube and the optical microscope, the sample stage having the sample placed thereon, wherein the sample stage is located inside the second enclosure.

7. The observation apparatus according to claim 4, further comprising a signal formation unit that converts image information acquired by the optical microscope into a digital signal, the signal formation unit being installed inside the second enclosure.

8. The observation apparatus according to claim 7, further comprising:

a cover part that can cover at least one side of the second enclosure; and a signal output port or a signal line lead-out port that outputs the signal from the optical microscope to the outside of the second enclosure, the port being furnished in the cover part.

9. The observation apparatus according to claim 4, further comprising a mechanism that operates the sample stage and a mechanism that operates movement of the optical microscope, the mechanisms being attached to a cover part that can cover at least one side of the second enclosure.

10. The observation apparatus according to claim 4, wherein:

at least part of the optical microscope is located inside the second enclosure; and an observation unit for observing an image from the optical microscope is located outside the second enclosure.

11. The observation apparatus according to claim 4, further comprising a vacuum pump that can bring about a vacuum state inside the second enclosure.

12. The observation apparatus according to claim 1, wherein the space in which the sample is placed is an atmosphere having pressures ranging from $10^3$ Pa to atmospheric pressure inclusive.

13. The observation apparatus according to claim 1, further comprising a gas introduction port that can replace the atmosphere at least in a space between the diaphragm and the sample with a gas other than air.

14. The observation apparatus according to claim 1, further comprising a drive mechanism that moves the position of optical lenses belonging to the optical microscope in the direction of the optical axis of the optical microscope.

15. An optical axis adjustment method for use with an observation apparatus having an optical microscope and a charged particle beam microscope including a charged particle optical tube, the observation apparatus permitting observation of an image from the charged particle beam microscope and an image from the optical microscope, the images being acquired of a sample placed in an atmosphere having pressures ranging from $10^3$ Pa to atmospheric pressure inclusive, the optical axis adjustment method comprising:

a diaphragm position adjustment step for adjusting the position of a diaphragm arranged to separate a space in which the sample is placed from the charged particle optical tube so that the center of the diaphragm is positioned on an extension of the optical axis of the charged particle beam microscope; and after the diaphragm position adjustment step above, a step for adjusting the position of the optical microscope, with the position of the diaphragm being fixed, so that the diaphragm center is positioned on an extension of the optical axis of the optical microscope.

16. An observation method for use with an observation apparatus having an optical microscope and a charged particle beam microscope including a charged particle optical tube, the observation apparatus permitting observation of an image from the charged particle beam microscope and an image from the optical microscope, the images being acquired of a sample placed in an atmosphere having pressures ranging from $10^3$ Pa to atmospheric pressure inclusive, the optical axis adjustment method comprising:

a diaphragm position adjustment step for adjusting the position of a diaphragm arranged to separate a space in which the sample is placed from the charged particle optical tube so that the center of the diaphragm is positioned on an extension of the optical axis of the charged particle beam microscope;

after the diaphragm position adjustment step, an optical microscope adjustment step for adjusting the position of the optical microscope, with the position of the diaphragm being fixed, so that the diaphragm center is positioned on an extension of the optical axis of the optical microscope;

after the optical microscope adjustment step, a focusing step for positioning a focus of the charged particle beam microscope and a focus of the optical microscope to a point close to the diaphragm; and after the focusing step, a moving step for moving the sample to the point close to the diaphragm.

* * * * *